United States Patent
Yamazaki et al.

(10) Patent No.: US 7,804,552 B2
(45) Date of Patent: *Sep. 28, 2010

(54) ELECTRO-OPTICAL DEVICE WITH LIGHT SHIELDING PORTION COMPRISING LAMINATED COLORED LAYERS, ELECTRICAL EQUIPMENT HAVING THE SAME, PORTABLE TELEPHONE HAVING THE SAME

(75) Inventors: Shunpei Yamazaki, Tokyo (JP); Yuugo Goto, Kanagawa (JP); Hideki Katsura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/848,642

(22) Filed: May 3, 2001

(65) Prior Publication Data
US 2002/0017645 A1 Feb. 14, 2002

(30) Foreign Application Priority Data
May 12, 2000 (JP) .............................. 2000-140960

(51) Int. Cl.
G02F 1/1343 (2006.01)
G02F 1/136 (2006.01)
G02F 1/1335 (2006.01)

(52) U.S. Cl. .............................. 349/44; 349/43; 349/46; 349/47; 349/106; 349/110; 349/111

(58) Field of Classification Search .................. 349/44, 349/106, 110, 156, 46
See application file for complete search history.

(56) References Cited

U.S. PATENT DOCUMENTS

| | | | |
|---|---|---|---|
| 4,470,667 A * | 9/1984 | Okubo et al. | 349/42 |
| 5,153,685 A | 10/1992 | Murata et al. | 357/23.6 |
| 5,200,846 A | 4/1993 | Hiroki et al. | |
| 5,287,205 A | 2/1994 | Yamazaki et al. | |
| 5,289,016 A * | 2/1994 | Noguchi | 257/57 |
| 5,373,377 A * | 12/1994 | Ogawa et al. | 349/40 |
| 5,453,856 A | 9/1995 | Kim | |
| 5,493,429 A * | 2/1996 | Kanemoto et al. | 349/106 |

(Continued)

FOREIGN PATENT DOCUMENTS

EP 1 128 430 A2 8/2001

(Continued)

OTHER PUBLICATIONS

1) JP 10-197712 English. abstract.

(Continued)

*Primary Examiner*—Andrew Schechter
(74) *Attorney, Agent, or Firm*—Husch Blackwell Sanders LLP

(57) ABSTRACT

An object of the present invention is to provide a pixel structure capable of shielding light between a TFT and a pixel without using a light shielding mask (black matrix) in an electro-optical display device. The present invention has a feature in that, as one of means for shielding light, a lamination film consisting of two colored layers (a lamination layer of a red-colored layer and a blue-colored layer) is formed on an opposing substrate as a light shielding portion so as to overlap with a TFT formed on a device electrode.

22 Claims, 19 Drawing Sheets

U.S. PATENT DOCUMENTS

| | | | |
|---|---|---|---|
| 5,576,858 A * | 11/1996 | Ukai et al. ............... 349/42 |
| 5,637,380 A * | 6/1997 | Kaneko et al. ............ 428/204 |
| 5,643,826 A | 7/1997 | Ohtani et al. |
| 5,680,187 A * | 10/1997 | Nagayama et al. ......... 349/110 |
| 5,757,451 A * | 5/1998 | Miyazaki et al. ......... 349/106 |
| 5,767,924 A | 6/1998 | Hiroki et al. |
| 5,777,701 A | 7/1998 | Zhang |
| 5,815,226 A | 9/1998 | Yamazaki et al. |
| 5,867,233 A | 2/1999 | Tanaka |
| 5,923,962 A | 7/1999 | Ohtani et al. |
| 5,986,738 A | 11/1999 | Tagusa et al. |
| 6,002,463 A * | 12/1999 | Fujikawa ............... 349/110 |
| 6,031,290 A | 2/2000 | Miyazaki et al. |
| 6,104,461 A | 8/2000 | Zhang et al. |
| 6,114,715 A | 9/2000 | Hamada ............... 257/72 |
| 6,118,506 A | 9/2000 | Yamazaki et al. |
| 6,144,082 A | 11/2000 | Yamazaki et al. |
| 6,175,395 B1 | 1/2001 | Yamazaki et al. |
| 6,208,395 B1 | 3/2001 | Kanoh et al. |
| 6,300,926 B1 * | 10/2001 | Yoneya et al. ........... 345/87 |
| 6,303,963 B1 | 10/2001 | Ohtani et al. ........... 257/350 |
| 6,339,459 B1 * | 1/2002 | Ichikawa et al. .......... 349/95 |
| 6,373,546 B1 | 4/2002 | Kim |
| 6,384,808 B2 | 5/2002 | Azami |
| 6,432,755 B2 | 8/2002 | Sung et al. |
| 6,436,815 B1 | 8/2002 | Yamazaki et al. |
| 6,461,899 B1 | 10/2002 | Kitakado et al. |
| 6,469,317 B1 | 10/2002 | Yamazaki et al. ......... 257/59 |
| 6,489,222 B2 | 12/2002 | Yoshimoto |
| 6,501,098 B2 | 12/2002 | Yamazaki ............... 257/72 |
| 6,524,877 B1 | 2/2003 | Nakazawa et al. |
| 6,545,359 B1 | 4/2003 | Ohtani et al. |
| 6,552,764 B2 * | 4/2003 | Fujioka et al. ........... 349/106 |
| 6,567,067 B2 | 5/2003 | Azami |
| 6,580,475 B2 | 6/2003 | Yamazaki et al. |
| 6,583,472 B1 | 6/2003 | Shibata et al. |
| 6,671,025 B1 * | 12/2003 | Ikeda et al. ............. 349/156 |
| 6,690,437 B2 | 2/2004 | Yamazaki et al. ......... 349/110 |
| 6,771,346 B2 | 8/2004 | Sugimoto et al. |
| 6,789,910 B2 | 9/2004 | Kimura et al. |
| 6,825,488 B2 | 11/2004 | Yamazaki et al. |
| 6,888,160 B1 | 5/2005 | Nakajima et al. |
| 7,023,021 B2 * | 4/2006 | Yamazaki et al. ......... 257/98 |
| 7,084,019 B2 | 8/2006 | Yamazaki et al. |
| 7,098,086 B2 | 8/2006 | Shibata et al. |
| 2001/0025959 A1 | 10/2001 | Yamazaki et al. |
| 2001/0030322 A1 * | 10/2001 | Yamazaki et al. ......... 257/59 |
| 2001/0040655 A1 | 11/2001 | Yamazaki et al. |
| 2002/0158288 A1 | 10/2002 | Yamazaki et al. |
| 2005/0056848 A1 | 3/2005 | Yamazaki et al. |
| 2006/0273317 A1 | 12/2006 | Yamazaki et al. |
| 2007/0184665 A1 | 8/2007 | Yamazaki et al. |

FOREIGN PATENT DOCUMENTS

| | | |
|---|---|---|
| JP | 1-101519 | 4/1989 |
| JP | 2287303 | 11/1990 |
| JP | 6-148685 | 5/1994 |
| JP | 7-235680 | 9/1995 |
| JP | 8-274336 | 10/1996 |
| JP | 9-160509 | 6/1997 |
| JP | 10-48640 | 2/1998 |
| JP | 10-073813 A * | 3/1998 |
| JP | 10073813 | 3/1998 |
| JP | 10-197712 | 7/1998 |

OTHER PUBLICATIONS

"Forming Protrusion and Spacer by Color Resist," Semiconductor World FPD, pp. 70-71, (2000) .11; with English abstract.

Sakurai, Yuzo, "Development of a Color Filter for LCDs Based on Polyimide Materials," IDW '99, pp. 363-366.

Yoshino, et al., "Development of a New Color Set of Transfer-Type Color filter Materials for LCDs," IDW '99, pp. 367-370.

Morozumi, "Materials and Assembling Process of LCDs (7.4. Color Filter Layer)," Liquid Crystals Applications and Uses, World Scientific Publishing Co., Pte., Ltd., vol. 1, pp. 178-181, (1990).

Luo, "Active Matrix LC Displays (15.5 Cell Assembly)," Liquid Crystals Applications and Uses, World Scientific Publishing Co., Pte., Ltd., vol. 1, pp. 421-423, (1990).

Amendment re pending U.S. Appl. No. 11/460,105 (to Shunpei Yamazaki et al, filed Jul. 26, 2006), dated Feb. 4, 2008.

Amendment re pending U.S. Appl. No. 10/959,056 (to Shunpei Yamazaki et al, filed Oct. 7, 2004), dated Jun. 3, 2008.

* cited by examiner

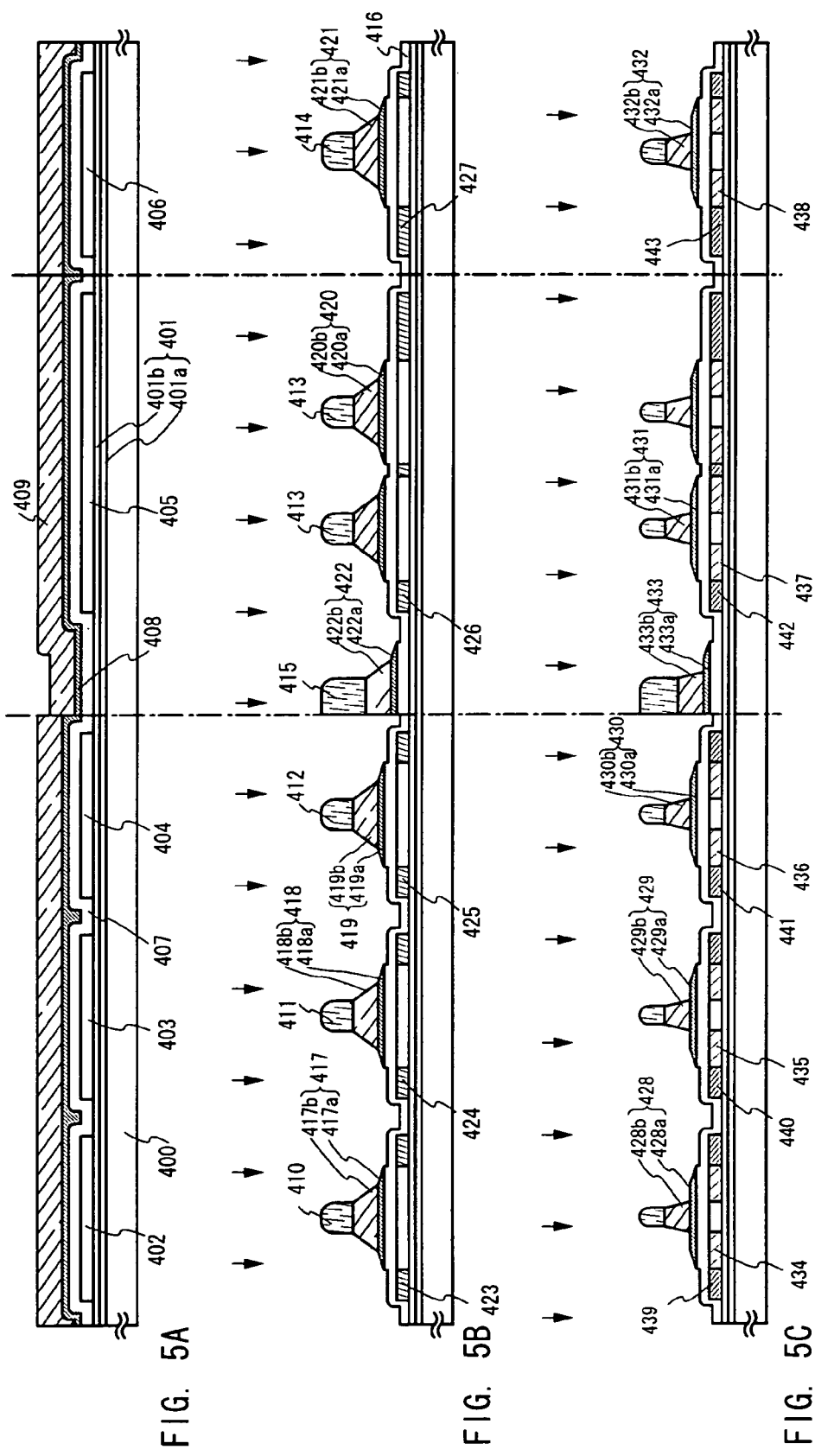

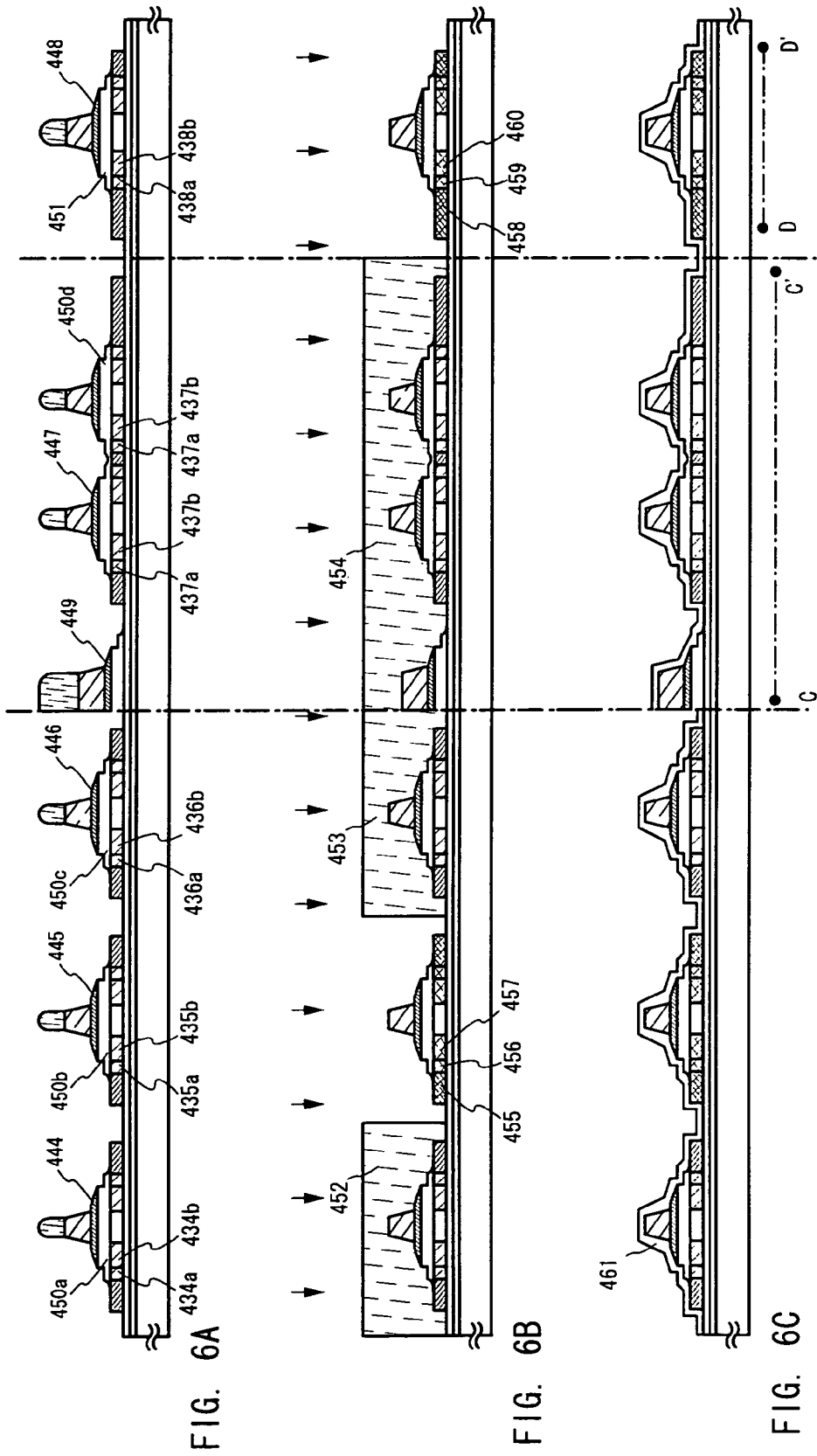

ELECTRO-OPTICAL DEVICE WITH LIGHT SHIELDING PORTION COMPRISING LAMINATED COLORED LAYERS, ELECTRICAL EQUIPMENT HAVING THE SAME, PORTABLE TELEPHONE HAVING THE SAME

BACKGROUND OF THE INVENTION

1. Field of the Invention

The present invention relates to a semiconductor device having a circuit constructed of a thin film transistor (hereinafter referred to as TFT), and to a method of manufacturing the same. For example, the present invention relates to an electro-optical device, which is represented by a liquid crystal display device, and to electronic equipment loaded with the electro-optical device as a part.

Note that, in this specification, the term semiconductor device indicates general devices that function by utilizing semiconductor characteristics, and that electro-optical devices, semiconductor circuits and electronic equipment are all included in the category of the semiconductor device.

2. Description of the Related Art

In recent years, a technique for constructing a thin film transistor (hereinafter referred to as TFT) using a semiconductor thin film (on the order of several to several hundreds nm in thickness) formed on the substrate having an insulating surface is attracting attention. The TFTs are widely used for electronic devices such as an IC or an electro-optical device, and the development of a switching element for a liquid crystal display device is particularly urgent. In this specification, an electro-optical device is a synonym of a display device.

In the liquid crystal devices, an attention is paid on an active matrix liquid crystal display device in which, to obtain an image with high quality, pixel electrodes are arranged in matrix and the TFT is used as a switching element for connecting the respective pixel electrodes.

The active matrix liquid crystal display devices are roughly classified into two types. There are known a transmission type and a reflection type active matrix liquid crystal display devices.

The transmission type liquid crystal display device conducts display by adjusting the passing of light by emitting light from the back of the liquid crystal using back light and making use of the form birefringence and the optical activity of the liquid crystal. Further, the transmission type liquid crystal display device is further increasing in demand as a display for a mobile computer or a video camera.

Further, in the liquid crystal display device, TFTs having semiconductors made of amorphous silicon or poly silicon, are arranged in matrix, and a liquid crystal material is sandwiched between an active matrix substrate on which a pixel electrode connected to each TFT, a source wiring and a gate wiring each are formed, and an opposing substrate having an opposing electrode arranged oppositely thereto. Besides, a color filter for displaying colors is stuck on the opposing substrate, and polarization plates are arranged on the active matrix substrate and the opposing substrate, respectively, as optical shutters, to perform the color display.

This color filter has colored layers consisting of R (red), G (green), and B (blue), a light shielding mask for covering only gaps between pixels, and extracting a red color, a green color and a blue color by transmitting light therethrough. The light shielding mask is for making clear the screen. Further, the light shielding mask is generally constructed of an organic film containing a metallic film (chromium etc.) or a black pigment. The color filters are arranged at positions corresponding to the pixel, thereby being capable of changing the color of light to be extracted for each pixel. Note that, the position corresponding to the pixel means the position that accords with the pixel electrode.

In a conventional liquid crystal display device using a metallic film as a light shielding mask of a color filter, the problem in that a parasitic capacitance with other wirings is formed and delay in signals tends to occur. Further, in consideration of the environment, a non-chromium material is attracting attention. Furthermore, in the case that an organic film containing a black pigment is used as a light shielding mask of a color filter, a problem in that the manufacturing steps increase occurs.

SUMMARY OF THE INVENTION

An object of the present invention is to provide a pixel structure capable of shielding light between a TFT and a pixel without using a light shielding mask (black matrix). The present invention has a feature in that, as one of means for shielding light, a lamination film consisting of two colored layers (a lamination layer of a red-colored layer and a blue-colored layer) is formed on an opposing substrate as a light shielding portion so as to overlap with a TFT formed on a device electrode.

In this specification, a "red-colored layer" is a layer which absorbs a part of light irradiated onto a colored layer to extract a red color therefrom. Further, similarly, a "blue-colored layer" is a layer which absorbs a part of light irradiated onto a colored layer to extract a blue color therefrom, and a "green colored" is a layer which absorbs a part of light irradiated onto a colored layer to extract a green color light therefrom.

According to one aspect of the present invention disclosed in this specification, there is provided an electro-optical device comprising a light shielding portion made of a lamination of a first colored layer and a second colored layer, characterized in that the light shielding portion is formed overlapping at least a channel forming region of the TFT. As a result, the step of forming a black matrix can be omitted.

According to another aspect of the present invention disclosed in this specification, there is provided an electro-optical device comprising: a plurality of pixel electrodes; a light shielding portion made of a lamination of a first colored layer and a second colored layer; characterized in that the light shielding portion is formed between an arbitrary pixel electrode and its adjacent pixel electrode while overlapping these electrodes. As a result, the step of forming a black matrix can be omitted.

In each of the above structures, it is characterized in that the first colored layer is blue. Further, the second colored layer is red.

Further, there is provided an electro-optical device characterized in that the light shielding portion is provided on a substrate formed with switching elements.

In each of the above structures, it is characterized in that the light shielding portion is provided on an opposing substrate.

Furthermore, in each of the above structures, it is characterized in that the electro-optical device is a transmission type liquid crystal display device in which the pixel electrode is made of a transparent conductive film.

BRIEF DESCRIPTION OF THE DRAWINGS

In the accompanying drawings:

FIGS. 5A to 5C show diagrams of a manufacturing process of an AM (active matrix type)-LCD;

FIGS. 6A to 6C show diagrams of the manufacturing process of the AM-LCD;

DETAILED DESCRIPTION OF THE PREFERRED EMBODIMENTS

An embodiment of the present invention of this specification are described below.

Figure 1A:
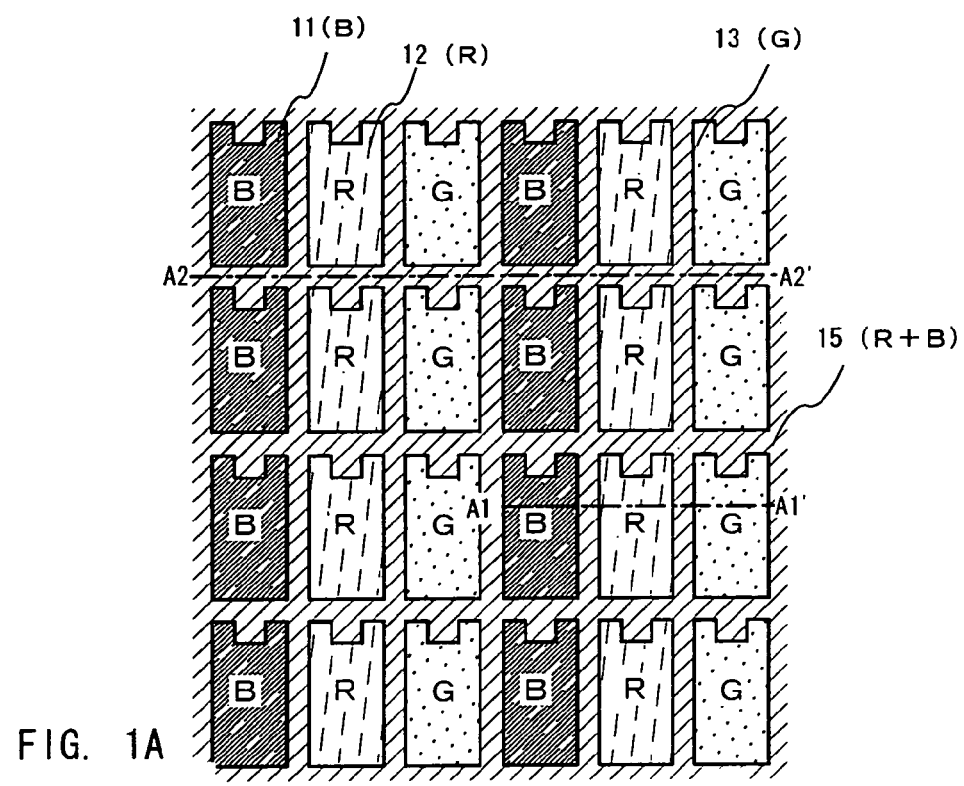
FIGS. 1A to 1C show a top view and cross-sectional views of an arrangement of colored layers.
Figure 1B:
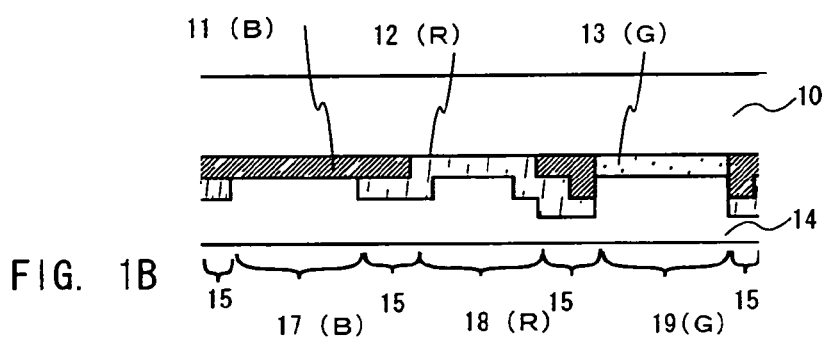
Figure 1C:
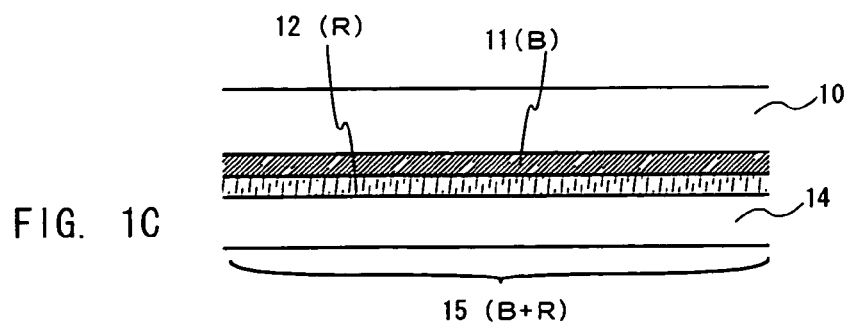

FIGS. 1A to 1C show the construction of the present invention. Here an example of a transmission type liquid crystal display device is shown and is described below.

FIG. 1A shows an example of forming 3 colored layers 11 to 13 and structuring a light shielding portion 15 and pixel openings 17 to 19. In general, the colored layer is formed by using a color resist made of an organic photosensitive material with a pigment dispersed.

The light shielding portion 15 is formed so as to shield light in the gap between the pixel and its adjacent pixel. Accordingly, the incident light is absorbed by the light shielding portion 15 and recognized to be mostly black by the observer. Further, the light shielding portion 15 is formed so as to overlap with the pixel TFT of the element substrate, and serves to shield the light from the outside from the pixel TFT.

The light shielding portion 15 is formed by laminating the blue colored layer 11 and the red colored layer 12. The blue colored layer is simultaneously patterned to the colored layer (B) 11 and the light shielding portion (R+B) 15. Further, the red colored layer is simultaneously patterned to the colored layer (R) 12 and the light shielding portion (R+B) 15.

FIG. 1B shows a sectional structure where the light shielding portion and the pixel opening portion in FIG. 1A are cut along the chain line (A1 to A1'). FIG. 1B shows an example in which after the colored layer (G) 13 is formed on an opposing substrate 10, by laminating the colored layer (B) 11 and the colored layer (R) 12, the light shielding portion (R+B) 15, the pixel opening (B) 17, the pixel opening (R) 18 and the pixel opening (G) 19 are formed. Thus, in FIG. 1C, after the colored layer (B) 11 is formed on an opposing substrate 10, the colored layer (R) 12 is formed. Further, the colored layers are covered by a leveling film 14.

In respect to the lamination film (light shielding portion 15) of the blue colored layer (B) 11 and the colored layer (R) 12, the respective transmittivities of the colored layers were measured by certain measurement conditions (white light source (D65), viewing angle: 2°, objective lens: 5 times). The measurement results are shown in Table 1.

TABLE 1

| wavelength [nm] | transmittivities of colored layers | | |
|---|---|---|---|
| | R + B | G + B | R + G |
| 400 | 6.6% | 14.7% | 7.6% |
| 450 | 3.2% | 7.7% | 1.8% |
| 500 | 3.4% | 23.4% | 2.5% |
| 550 | 0.6% | 6.1% | 3.8% |
| 600 | 0.4% | 0.5% | 15.4% |
| 650 | 1.1% | 0.5% | 2.1% |
| 700 | 2.4% | 1.1% | 12.9% |
| 750 | 1.2% | 1.5% | 24.9% |
| 800 | 36.2% | 30.7% | 56.0% |

Figure 3:
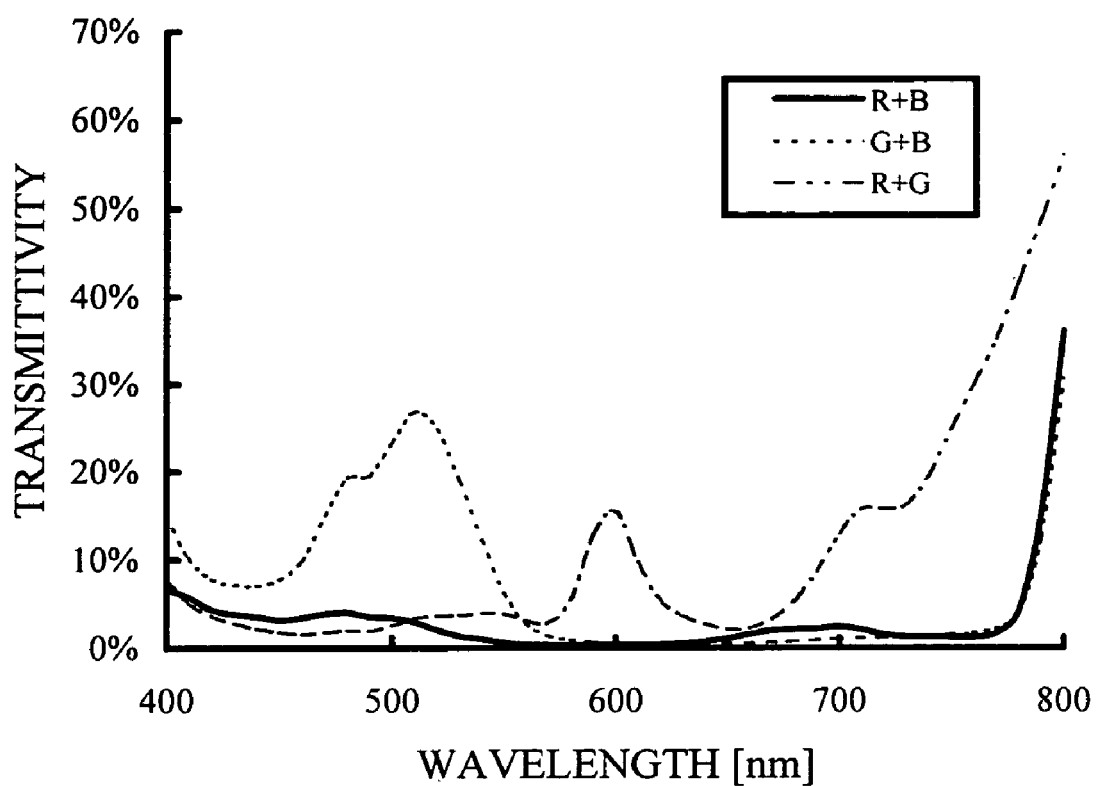
FIG. 3 shows a diagram showing a reflectivity of the laminated colored layers.

Further, FIG. 3 shows a graph representing Table 1.

As shown in Table. 1 and FIG. 3, the transmittivity of the R+B (corresponding to the light shielding portion 15) layer becomes 7% or less in the visible light region (in a 400 to 700 nm wavelength region), which sufficiently functions as a light shielding mask.

Further, if three layers of colored layers are laminated, although the light shielding property is enhanced, the unevenness thereof enlarges accordingly. As a result, the flatness of the substrate is eliminated to cause the disturbance of the liquid crystal layer. In particular, it is a major problem to liquid crystal materials where the evenness of the base affects the orientation as with ferroelectric liquid crystal. However, like the present invention, if only two colored layers are laminated into one, this is a level which hardly influences the flatness of the substrate and the liquid crystal layers.

In this way, the present invention is characterized in that the light shielding mask is formed by a lamination film (R+B) consisting of two colored-layers. As a result, a step of manufacturing the black matrix can be omitted, reducing the number of manufacturing steps.

However, the cross-sectional views shown in FIGS. 1B and 1C are examples, and therefore is not particularly limited thereto. For example, it may take a structure shown in FIGS. 2B and 2C. FIG. 2B shows an example in which after a colored layer (G) 23 is formed on the opposing substrate 20, by laminating a colored layer (R) 22 and a colored layer (B) 21, a light shielding portion (R+B) 25, a pixel opening (B) 27, a pixel opening (R) 28 and a pixel opening (G) 29 are formed. Therefore, FIG. 2C shows the case where after the colored layer (R) 22 is formed on the opposing substrate 20, the colored layer (B) 21 is laminated, and the light shielding portion (B+R) 25 is formed. Further, a leveling film 24 covers the colored layers.

Figure 4A:
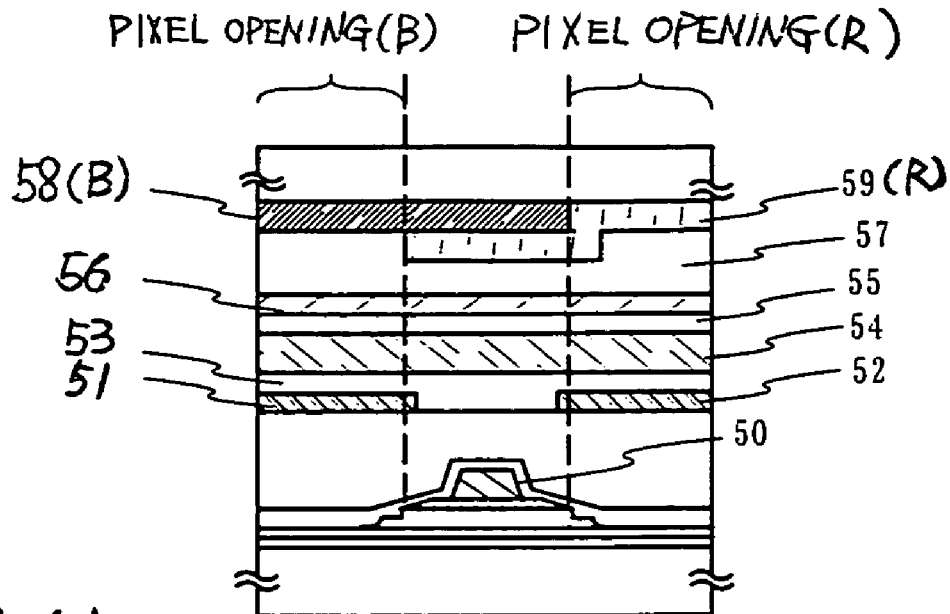
FIGS. 4A and 4B show a diagram showing the lamination of the wiring and the colored layers.
Figure 4B:
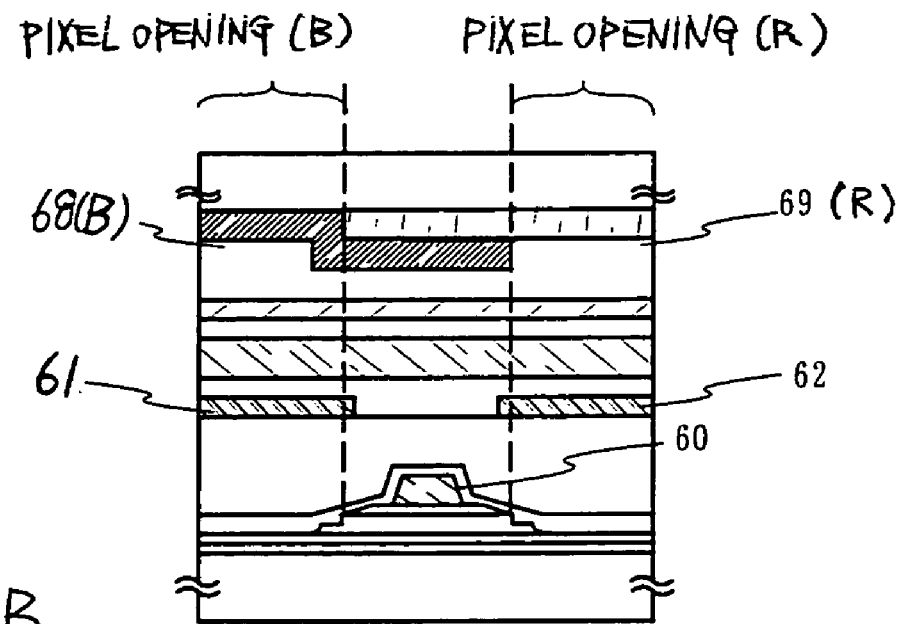

FIGS. 4A and 4B show the positional relationship of the wiring between the pixel electrodes, the pixel electrodes, and the colored layers. FIG. 4A corresponds to FIGS. 1A to 1C. FIG. 4A shows an example where a colored layer (R) 59 is formed such that a portion thereof overlaps with an end portion of a colored layer (B) 58 above a source wiring 50 in order to shield light between a pixel electrode 51 and a pixel electrode 52. The overlapping portion of the colored layer (B) 58 and the colored layer (R) 59 should be provided above the source wiring 50. Note that, in FIG. 4A, reference numerals 53 and 55 indicate orientation films, reference numeral 54 indicates a liquid crystal, reference numeral 56 indicates an opposing electrode, and reference numeral 57 indicates a leveling film.

The structure as shown in FIG. 4B may be implemented. FIG. 4B corresponds to FIGS. 2A to 2C. FIG. 4B is an example where a colored layer (B) 68 is formed such that a portion thereof overlaps with an end portion of a colored layer (R) 69 above a source wiring 60, in order to shield light between a pixel electrode 61 and a pixel electrode 62.

Note that, the present invention is not only limited to the examples shown in FIGS. 4A and 4B, and the light shielding portion (overlapping portion) formed by patterning the two colored layers may be enlarged to provide light shielding portions in the peripheral portions of the source wiring. By using this light shielding portion, the leaking of light that occurs at the time of inverse driving of the source line is hidden, so that the contrast is improved.

Further, the light that has passed through the pixel openings 17 to 19 is colored by the single layered colored layers 11 to 13 which are colored by the corresponding colors and recognized by the observer. Note that, FIG. 1B shows the sectional structure where the pixel opening in FIG. 1A is cut along the chain line (A1 to A1'). As shown in FIG. 1C, the single layered colored layers 11 and 12 are formed sequentially on the opposing substrate 10. Further, the leveling film 14 covering the colored layers 11 and 12 is formed.

Figure 17:
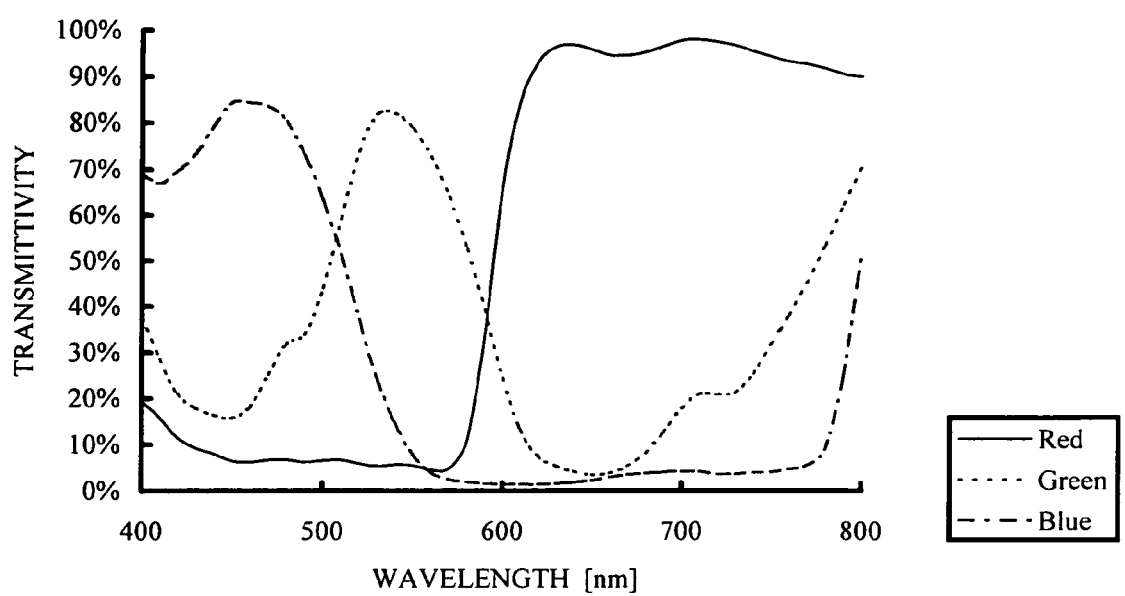
FIG. 17 shows a diagram of transmittivity of a single layer of the colored layers.

In the pixel opening, as with the result of the transmittivity of the conventional single layer shown in FIG. 17, the blue colored layer shows a transmittivity exceeding 85% near 450 nm. Further, the green colored layer shows a transmittivity exceeding 80% near 530 nm. Further, the red colored layer shows a transmittivity exceeding 90% near 600 to 800 nm.

Here, it is an example of a transmission type liquid crystal display device, so that light incident to the pixel openings 17 to 19 passes through the pixel electrode and the liquid crystal layer, and then after passing through the respective single layered colored layers 11 to 13, the respective lights are extracted to be recognized by the observer.

Further, for the colored layers 11 to 13, a most simple stripe pattern as well as a diagonal mosaic alignment, a triangle mosaic alignment, an RGBG four pixel alignment, an RGBW four pixel alignment or the like may be used.

The invention of this specification with the above structures is further described in detail referring to the embodiments below.

Embodiment 1

An embodiment of the present invention will be described hereinbelow with taking as an example a manufacturing of an opposing substrate which will be employed for an active matrix liquid crystal display device. FIG. 1 shows a schematic view of an opposing substrate with a colored layer formed according to this invention.

First, as an opposing substrate 10 having light transmission property, a glass substrate such as barium borosilicate glass or aluminum borosilicate, represented by such as Corning #7059 glass or #1737 glass is prepared. In addition to the above, a light transmission type substrate such as a quartz substrate and a plastic substrate may also be used.

Next, an organic photosensitive material (CRY-8000: color mosaic made by Fuji Film Olin Corp.) is applied on the opposing substrate 10, and by photolithography this organic photosensitive material is patterned in a grid-shape as shown in FIG. 1A to form a green colored layer (G) 13. Note that this region becomes a pixel opening 19 with respect to the green colored layer (G) 13.

Next, an organic photosensitive material (CGY-8000: color mosaic made by Fuji Film Olin Corp.) is applied to the predetermined position, and by photolithography, this organic photosensitive material is patterned into a shape as shown in FIG. 1A to form the blue colored layer (B) 11 in the predetermined position.

Next, an organic photosensitive material (CM-8000: color mosaic made by Fuji Film Olin Corp.) is applied to the predetermined position and by photolithography, this organic photosensitive material is patterned into a shape as shown in FIG. 1A to form a red colored layer (R) 12. As shown in FIG. 1, a portion of the blue colored layer (B) 11 overlaps a portion of the red colored layer (R) 12 to form a light shielding portion 15. The mask is designed such that at least the light shielding portion 15 overlaps with the pixel TFT, the gate wiring (not shown), and the source wiring (not shown). On the other hand, as shown in FIG. 1B, the region of the blue colored layer (B) 11 which does not overlap with the red colored layer (R) 12, becomes a blue pixel opening (B) 17. Further, the region of the red colored layer (R) 12 which does not overlap with the blue colored layer (B) 11, becomes a red pixel opening (R) 18.

Note that, the light shielding portion 15 is formed to overlap with a TFT channel forming region when it is adhered together with the element substrate on which the TFT is provided.

Thus, by three times of photolithography, the pixel openings 17 to 19, and the light shielding portion 15 can be formed.

Subsequently, a leveling film 14 for covering the respective colored layers is formed. Between a single layer of the colored layer and a two layer of the colored layer, about 1 to 1.5 μm of a step arises, and therefore the leveling film 14 has to have a film thickness of 1 μm or more, preferably 2 μm. As for the leveling film 14, an organic material having light transmission property, for example, an organic resin material such as polyimide, acryl, polyamide, polyimideamide, BCB (benzocyclobutene) may be used. However, if the flatness is not a problem, this leveling film is not necessary.

Note that, in this embodiment, an organic photosensitive material is applied, and patterned into a desired shape to obtain the respective colored layers 11 to 13. However, it is needless to say that the manufacturing method thereof is not particularly limited to those.

Hereafter, although not shown, an opposing electrode made from a transparent conductive film is formed on the leveling film, and further thereon, an orientation film for orientating the liquid crystal material is formed, and furthermore, if necessary, the orientation process is performed thereonto.

Using the opposing substrate thus obtained, an active matrix liquid crystal display device is manufactured.

Embodiment 2

In Embodiment 1, an example where the green colored layer (G) 13, the blue colored layer (B) 11, the red colored layer (R) 12 are sequentially formed is shown, but an example where the colored layers are formed in a order different from that of Embodiment 1 is shown below.

Figure 2A:
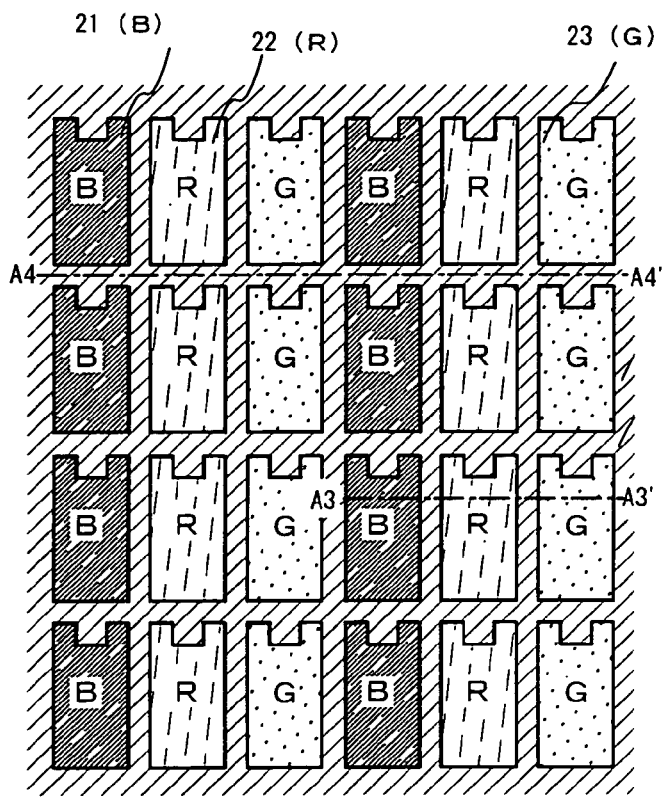
FIGS. 2A to 2C show cross-sectional views of the colored layers.
Figure 2B:
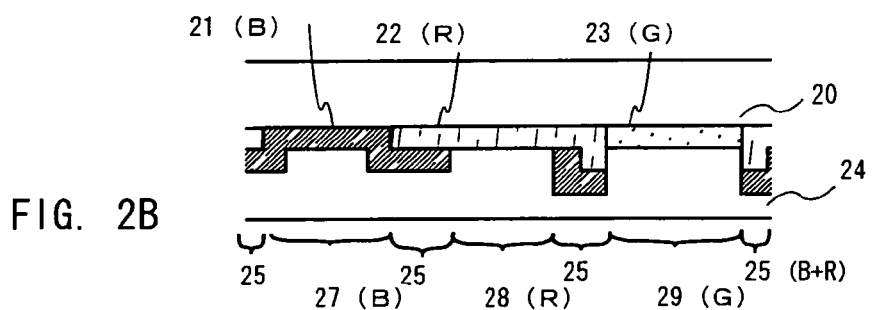
Figure 2C:
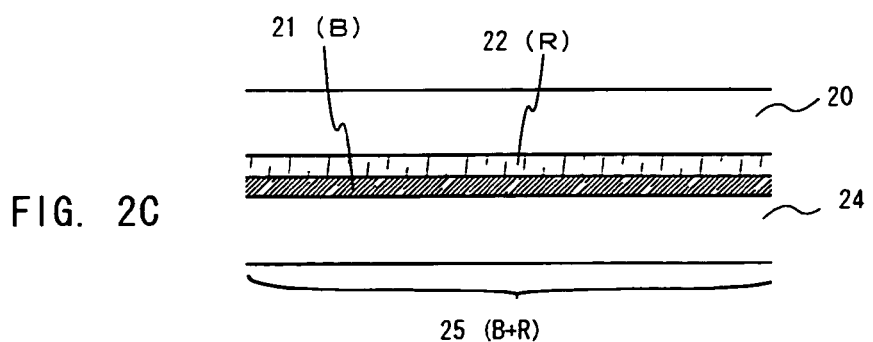

FIG. 2A shows an example where first a colored layer (G) 23 is formed and then is laminated with a colored layer (R) 22 and a colored layer (B) 21. Note that, FIG. 2B corresponds to a cross sectional structural diagram cut along the chain line A3 to A3' of FIG. 2A, and FIG. 2C corresponds to a cross sectional structural diagram cut along the chain line A4 to A4' of FIG. 2A.

As an opposing substrate 20, the substrate adopted in Embodiment 1 is used.

First, an organic photosensitive material (CRY-8000: color mosaic made by Fuji Film Olin Corp.) is applied on the opposing substrate 20, and by photolithography this organic photosensitive material is patterned in a grid-shape as shown in FIG. 2A to form a green colored layer (G) 23. Note that this region becomes a pixel opening 29 with respect to the green colored layer (G) 23.

Next an organic photosensitive material (CGY-8000: color mosaic made by Fuji Film Olin Corp.) is applied to the predetermined position and by photolithography, this organic photosensitive material is patterned into a shape as shown in FIG. 2A to form the red colored layer (R) 22 in a predetermined position.

Next an organic photosensitive material (CM-8000: color mosaic made by Fuji Film Olin Corp.) is applied to the predetermined position and by photolithography, this organic photosensitive material is patterned into a shape as shown in FIG. 2A to form a blue colored layer (B) 21. As shown in FIGS. 2A and 2B, this red colored layer (R) 22 overlaps a portion of the blue colored layer (B) 21 to form a light shielding portion 25. On the other hand, as shown in FIG. 2B, the region of the blue colored layer (B) 21 which does not overlap with the red colored layer (R) 22, becomes a blue pixel opening (B) 27. Further, the region of the red colored layer (R) 22 which does not overlap with the blue colored layer (R) 21, becomes a red pixel opening (R) 28.

Note that, the light shielding portion 25 is formed to overlap with a TFT channel forming region when it is adhered together with the active substrate on which the TFT is provided.

Thus, by three times of photolithography, the pixel openings 27 to 29, and the first light shielding portion 15 can be formed.

Subsequently, a leveling film 24 for covering the respective colored layers is formed. Between a single layer of the colored layer and a two layer of the colored layer, about 1 to 1.5 μm of a step arises, and therefore the leveling film 24 has to have a film thickness of 1 μm or more, preferably 2 μm. As for the leveling film 24, an organic material having light transmission property, for example, an organic resin material such as polyimide, acryl, polyamide, polyimideamide, BCB (benzocyclobutene) may be used. However, if the flatness is not a problem, this leveling film is not necessary.

Note that, in this embodiment, an organic photosensitive material is applied, and is patterned into a desired shape to obtain the respective colored layers 21 to 23.

However, it is needless to say that the manufacturing method thereof is not particularly limited to those.

Hereafter, although not shown, an opposing electrode made from a transparent conductive film is formed on the leveling film, and further thereon, an orientation film for orientating the liquid crystal is formed, and furthermore, if necessary, the orientation process is performed thereonto.

Using the opposing substrate thus obtained, an active matrix liquid crystal display device is manufactured.

Embodiment 3

In this embodiment, a method of manufacturing an active matrix substrate is described with reference to FIGS. 5 to 11.

In this embodiment, a description will be made of a manufacturing method of an active matrix substrate (also referred to as device substrate) which is stuck with an opposing substrate obtained in Embodiment 1 or Embodiment 2. Here, a method of simultaneously forming, on the same substrate, a pixel portion and TFTs (n-channel TFT and p-channel TFT) of a driver circuit formed in the periphery of the pixel portion, is described in detail.

First, in this embodiment, a substrate 400 is used, which is made from glass, such as barium borosilicate glass or aluminum borosilicate glass, represented by such as Corning #7059 glass and #1737 glass. Note that, as the substrate 400, a quartz substrate may be used as the replace. A plastic substrate having heat resistance to a process temperature of this embodiment may also be used. There is no particular limitation on a substrate provided that is has a transparent property.

Then, as shown in FIG. 5A, a base film 401 formed from an insulating film such as a silicon oxide film, a silicon nitride film or a silicon nitride oxide film. In this embodiment, a two-layer structure is used as the base film 401. However, a single-layer film or a lamination structure consisting of two or more layers of the insulating film may be used. As a first layer of the base film 401, a silicon nitride oxide film 401a is formed into a thickness of 10 to 200 nm (preferably 50 to 100 nm) using $SiH_4$, $NH_3$, and $N_2O$ as reaction gases by a plasma CVD method. In this embodiment, the silicon nitride oxide film 401a (composition ratio Si=32%, O=27%, N=24% and H=17%) having a film thickness of 50 nm is formed. Then, as a second layer of the base film 401, a silicon nitride oxide film 401b is formed so as to laminate thereon into a thickness of 50 to 200 nm (preferably 100 to 150 nm) using $SiH_4$ and $N_2O$ as reaction gases by a plasma CVD method. In this embodiment, the silicon nitride oxide film 401b (composition ratio Si=32%, O=59%, N=7% and H=2%) having a film thickness of 100 nm is formed.

Subsequently, semiconductor layers 402 to 406 are formed on the base film. The semiconductor layers 402 to 406 are formed from a semiconductor film having an amorphous structure by a known method (such as a sputtering method, an LPCVD method, or a plasma CVD method), and is subjected to a known crystallization process (such as a laser crystallization method, a thermal crystallization method, or a thermal crystallization method using a catalyst such as nickel). The crystalline semiconductor film thus obtained is patterned into desired shapes to obtain the semiconductor layers. The semiconductor layers 402 to 406 are formed into the thickness of from 25 to 80 nm (preferably 30 to 60 nm). The material of the crystalline semiconductor film is not particularly limited, but it is preferable to form the film using silicon, a silicon germanium (SiGe) alloy, or the like. In this embodiment, a 55 nm thick amorphous silicon film is formed by a plasma CVD method, and then, nickel-containing solution is held on the amorphous silicon film. A dehydrogenation process of the amorphous silicon film is performed (500° C. for one hour), and thereafter a thermal crystallization process is performed (550° C. for four hours) thereto. Further, to improve the crystallinity thereof, laser anneal treatment is performed to form the crystalline silicon film. Then, this crystalline silicon film is subjected to a patterning process using a photolithography method, to obtain the semiconductor layers 402 to 406.

Further, after the formation of the semiconductor layers 402 to 406, a minute amount of impurity element (boron or phosphorus) may be doped to control a threshold of the TFT.

Besides, in the case where the crystalline semiconductor film is manufactured by the laser crystallization method, a pulse oscillation type or continuous-wave type excimer laser, YAG laser, or $YVO_4$ laser may be used. In the case where those lasers are used, it is appropriate to use a method in which laser light radiated from a laser oscillator is condensed by an optical system into a linear beam, and is irradiated to the amorphous semiconductor film. Although the conditions of the crystallization should be properly selected by an operator, in the case where the excimer laser is used, a pulse oscillation frequency is set as 30 Hz, and a laser energy density is set as 100 to 400 mJ/cm$^2$ (typically 200 to 300 mJ/cm$^2$). In the case where the YAG laser is used, it is appropriate that the second harmonic is used to set a pulse oscillation frequency as 1 to 10 kHz, and a laser energy density is set as 300 to 600 mJ/cm$^2$ (typically, 350 to 500 mJ/cm$^2$). Then, laser light condensed into a linear shape with a width of 100 to 1000 μm, for example, 400 μm is irradiated to the whole surface of the substrate, and an overlapping ratio (overlap ratio) of the linear laser light at this time may be set as 80 to 98%.

A gate insulating film 407 is then formed for covering the semiconductor layers 402 to 406. The gate insulating film 407 is formed from an insulating film containing silicon by a plasma CVD method or a sputtering method into a film thickness of from 40 to 150 nm. In this embodiment, the gate insulating film 407 is formed from a silicon nitride oxide film into a thickness of 110 nm by plasma CVD (composition ratio Si=32%, O=59%, N=7%, and H=2%). Of course, the gate insulating film is not limited to the silicon nitride oxide film, an insulating film containing other silicon may be formed into a single layer of a lamination structure.

Besides, when the silicon oxide film is used, it can be formed by a plasma CVD method in which TEOS (tetraethyl orthosilicate) and O$_2$ are mixed, with a reaction pressure of 40 Pa, a substrate temperature of from 300 to 400° C., and discharged at a high frequency (13.56 MHz) power density of 0.5 to 0.8 W/cm$^2$. Good characteristics as the gate insulating film can be obtained in the silicon oxide film thus manufactured by subsequent thermal annealing at 400 to 500° C.

Then, on the gate insulating film 407, a first conductive film 408 and a second conductive film 409 are formed into lamination to have a film thickness of 20 to 100 nm and 100 to 400 nm, respectively. In this embodiment, the first conductive film 408 made from a TaN film with a film thickness of 30 nm and the second conductive film 409 made from a W film with a film thickness of 370 nm are formed into lamination. The TaN film is formed by a sputtering method with a Ta target under a nitrogen containing atmosphere. Besides, the W film is formed by the sputtering method with a W target. The W film may be formed by a thermal CVD method using tungsten hexafluoride (WF$_6$). Whichever method is used, it is necessary to make the material have low resistance for use as the gate electrode, and it is preferred that the resistivity of the W film is set to less than or equal to 20 μΩcm. By making the crystal grains large, it is possible to make the W film have lower resistivity. However, in the case where many impurity elements such as oxygen are contained within the W film, crystallization is inhibited and the resistance becomes higher. Therefore, in this embodiment, by forming the W film by a sputtering method using a W target having a high purity (purity of 99.9999%), and in addition, by taking sufficient consideration to prevent impurities within the gas phase from mixing therein during the film formation, a resistivity of from 9 to 20 μΩcm can be realized.

Note that, in this embodiment, the first conductive film 408 is made of TaN, and the second conductive film 409 is made of W, but the material is not particularly limited thereto, and either film may be formed of an element selected from Ta, W, Ti, Mo, Al, and Cu, or an alloy material or a compound material containing the above element as its main ingredient. Besides, a semiconductor film typified by a polycrystalline silicon film doped with an impurity element such as phosphorus may be used. Further, an AgPdCu alloy may be used.

Besides, any combination may be employed such as a combination in which the first conductive film is formed of tantalum (Ta) film and the second conductive film is formed of a W film, a combination in which the first conductive film is formed of titanium nitride (TiN) film and the second conductive film is formed of a W film, a combination in which the first conductive film is formed of tantalum nitride (TaN) and the second conductive film is formed of an Al film, or a combination in which the first conductive film is formed of tantalum nitride (TaN) film and the second conductive film is formed of a Cu film.

Next, masks 410 to 415 made of resist are formed using a photolithography method, and a first etching process for forming electrodes and wirings is conducted. The first etching process is conducted under the first and second etching conditions. In this embodiment, as the first etching conditions, an ICP (inductively coupled plasma) etching method is used, in which CF$_4$, Cl$_2$ and O$_2$ are used as an etching gas, gas flow rate of each gas is set as 25/25/10 (sccm), RF power of 500 W is applied to a coil-shaped electrode of a pressure of 1 Pa, to generate plasma and conduct etching. Here, a dry etching device using ICP (Model E645-□ICP) of Matsushita Electric Industrial Co., Ltd. is used. An RF power (13.56 MHz) of 150 W is also applied to the side of the substrate (a sample stage) and a substantially negative self bias voltage is applied thereto. Based on this first etching conditions, the W film is etched to make an end portion of the first conductive layer into a tapered shape.

Thereafter, the etching condition is changed into a second etching condition, and the etching is performed, without removing masks 410 to 415 consisting of resist, in which CF$_4$ and Cl$_2$ are used as the etching gases, a gas flow rate of each gas is set as 30/30 (sccm), and an RF (13.56 MHz) power of 500 W is applied to a coil type electrode under a pressure of 1 Pa to generate plasma. Thus, the etching is performed for about 30 seconds. An RF (13.56 MHz) power of 20 W is also applied to the side of the substrate (sample stage) and a substantially negative self bias voltage is applied thereto. In the second etching condition, in which CF$_4$ and Cl$_2$ are mixed, the W film and the TaN film are etched in the same degree. Note that, in order to perform the etching without leaving a residue on the gate insulating film, it is appropriate that an etching time is increased at a rate on the order of 10 to 20%.

Under the above first etching condition, by making the shapes of the masks consisting of resist suitable, end portions of the first conductive layer and the second conductive layer become the tapered shape by the effect of the bias voltage applied to the substrate side. The angle of the taper portion becomes 15 to 45°. In this way, first shape conductive layers 417 to 422 consisting of the first conductive layers and the second conductive layers (the first conductive layers 417a to 422a and the second conductive layers 417b to 422b) are formed by the first etching process. Reference is numeral 416 denotes a gate insulating film, and regions which are not covered with the first shape conductive layers 417 to 422 are etched by about 20 to 50 nm so that thinned regions are formed.

Then, a first doping process is performed without removing the masks consisting of resist, and an impurity element that imparts an n-type is added to the semiconductor layer (FIG. 5B). Doping may be performed by an ion doping method or an ion implanting method. The condition of the ion doping method is such that a dosage is $1 \times 10^{13}$ to $5 \times 10^{15}$ atoms/cm$^2$, and an acceleration voltage is 60 to 100 keV. In this embodiment, the dosage is set as $1.5 \times 10^{15}$ atoms/cm$^2$, and the acceleration voltage is set as 80 keV. As the impurity element imparting the n-type conductivity, an element belonging to group 15, typically phosphorus (P) or arsenic (As) may be used, but phosphorus (P) is used here. In this case, the conductive layers 417 to 421 become masks to the impurity element imparting the n-type conductivity, and low concentration impurity regions 423 to 427 are formed in a self aligning manner. The impurity element imparting the n-type conductivity in the concentration range of $1 \times 10^{20}$ to $1 \times 10^{21}$ atoms/cm$^3$ is added to the high concentration impurity regions 423 to 427.

Next, a second etching process is performed without removing the masks consisting of resist (FIG. 5C). In the second etching process, CF$_4$, Cl$_2$ and O$_2$ are used as the etching gases, and a W film is selectively etched. At this time, by the second etching process, first conductive layers 428b to 433b are formed. On the other hand, the second conductive layers 417a to 422a are hardly etched, and second conductive layers 428a to 433a are formed. Next a second doping process is conducted to obtain the state as shown in FIG. 5C. The doping is performed such that the second conductive layers 417a to 422a are used as the masks to the impurity element, and the impurity element is added also to the semiconductor layer under the tapered portion of the first conductive layers. In this way, impurity regions 434 to 438 overlapping with the first conductive layers are formed. The concentration of phosphorus (P) to be added to the impurity regions becomes gradually lower according to the film thickness of the tapered portion of the first conductive layers. Note that, in the semiconductor layer overlapping with the tapered portion of the first conductive layer, the impurity concentration is lowered from the end portion of the tapered portion of the first conductive layer toward the inside, but the concentration substantially keeps the same degree. Further, an impurity element is added to the first impurity regions 423 to 427 to form impurity regions 439 to 443.

Next, a third etching process is performed without removing the masks consisting of resist as shown in FIG. 6A. In the third etching process, the tapered portion of the first conductive layer is partially etched, to reduce the region overlapping with the semiconductor layer. The third etching uses CHF$_3$ as an etching gas with a reactive ion etching method (RIE method). With the third etching, first conductive layers 444 to 449 are formed. At this time, the insulating film 416 is simultaneously etched to form insulating films 450a to 450d and 451.

In the third etching, impurity regions (LDD regions) 434a to 438a that do not overlap with the first conductive layers 444 to 448 are formed. Note that, impurity regions (GOLD regions) 434b to 438b still are overlapped with the first conductive layers 444 to 448.

In this way, in this embodiment, the difference between the impurity concentration in the impurity regions (GOLD regions) 434b to 438b which overlap with the first conductive layers 444 to 448 and the impurity concentration in the impurity regions (LDD regions) 434a to 438a which do not overlap with the first conductive layers 444 to 448 may be made small, thereby improving reliability.

Then, as shown in FIG. 6B, after removing the masks consisting of resist, new masks 452 to 454 consisting of resist are formed, and a third doping process is performed. With this third doping process, impurity regions 455 to 460, in which an impurity element imparting a conductivity opposite to the above one conductivity type is added into the semiconductor layer that becomes an active layer of a p-channel TFT, are formed. The second conductive layers 428a to 432a are used as the masks with respect to the impurity elements, and an impurity element imparting a p-type conductivity is added to form the impurity regions in a self aligning manner. In this embodiment, the impurity regions 455 to 460 are formed by ion doping using diborane (B$_2$H$_6$). At the time of performing the third doping process, the semiconductive layer forming the n-channel TFT is covered with the masks 452 to 454 consisting of resist. With the first and the second doping processes, the impurity regions 455 to 460 are doped with phosphorus with different concentrations, respectively. However, doping is performed so that the concentration of the impurity element imparting p-type conductivity in any of the regions falls within the range of $2 \times 10^{20}$ to $2 \times 10^{21}$ atoms/cm$^3$, with the result that the regions function as source regions and drain regions of the p-channel TFT, which cause no problems. In this embodiment, a portion of the semiconductor layer to be an active layer of the p-channel TFT is exposed, so that there is the advantage that the impurity element (boron) is easily added.

By the steps up to here, the impurity regions are formed in the respective semiconductor layers.

Subsequently, the masks 452 to 454 consisting of resist are removed, and a first interlayer insulating film 461 is formed. This first interlayer insulating film 461 is formed from an insulating film containing silicon by a plasma CVD method or a sputtering method into a thickness of 100 to 200 nm. In this embodiment, a silicon nitride oxide film with a film thickness of 150 nm is formed by a plasma CVD method. Of course, the first interlayer insulating film 461 is not particularly limited to the silicon nitride oxide film, but an insulating film containing other silicon may be formed into a single layer or a lamination structure.

Then, as shown in FIG. 6C, a step of activating the impurity elements added in the respective semiconductor layers is performed. This step is carried out by a thermal annealing method using a furnace annealing oven. The thermal annealing method may be performed in a nitrogen atmosphere having an oxygen concentration of 1 ppm or less, preferably 0.1 ppm or less and at 400 to 700° C., typically 500 to 550° C. In this embodiment, a heat treatment at 550° C. for 4 hours is carried out. Note that, other than the thermal annealing method, a laser annealing method, or a rapid thermal annealing method (RTA method) can be applied thereto.

Note that, in this embodiment, at the same time as the above activation process, nickel used as the catalyst for crystallization is gettered to the impurity regions 439, 441, 442, 455 and 458 containing phosphorous at a high concentration. As a result, nickel concentration of the semiconductor layer which becomes a channel forming region is mainly lowered. The TFT having a channel forming region thus formed is decreased in off current, and has high electric field mobility because of good crystallinity, thereby attaining satisfactory characteristics.

Further, an activation process may be performed before forming the first interlayer insulating film. However, in the case where a wiring material used is weak against heat, it is preferable that the activation process is performed after an interlayer insulating film (containing silicon as its main ingredient, for example, silicon nitride oxide film) is formed to protect the wiring or the like as in the present embodiment.

Figure 7:
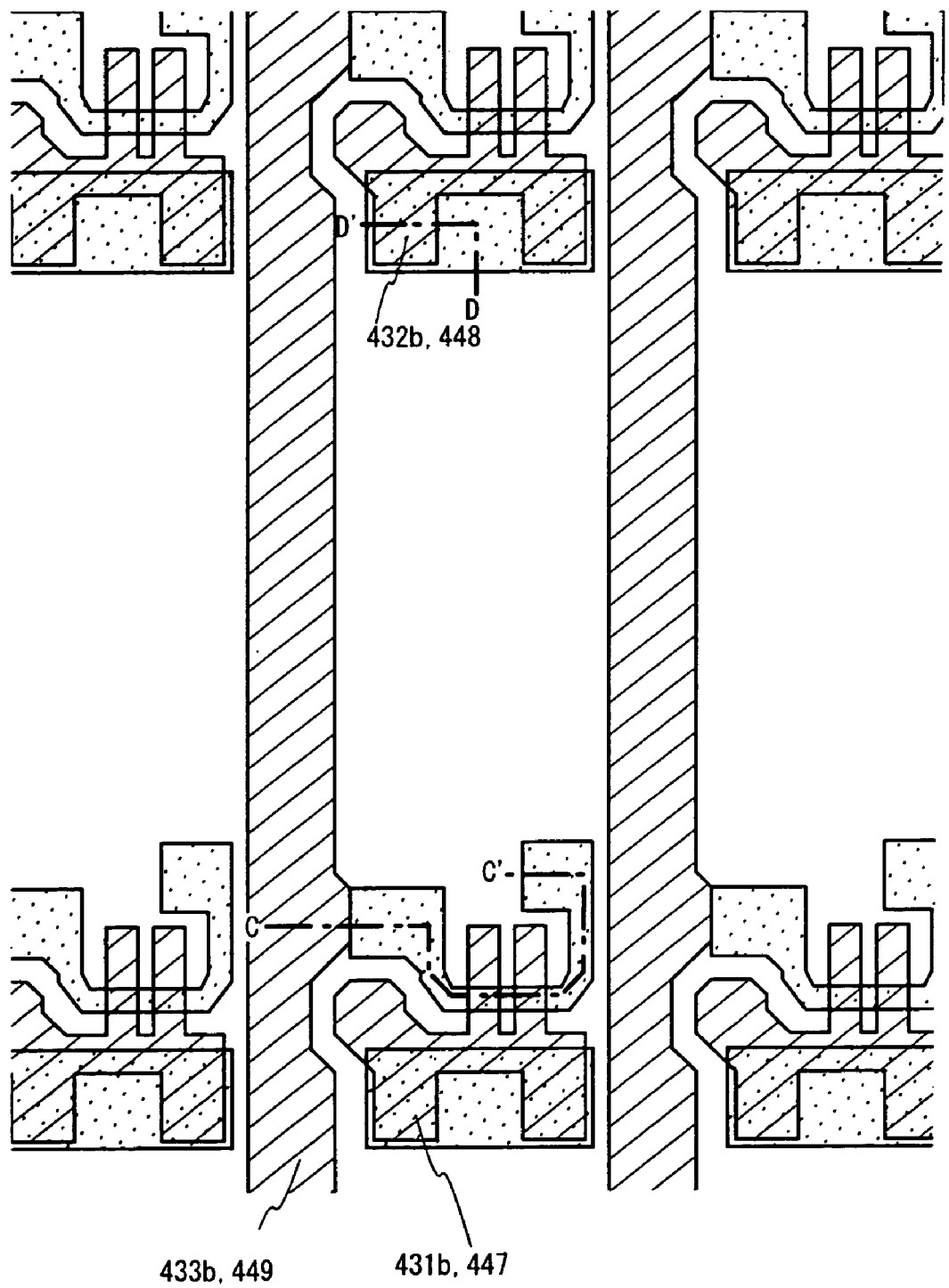
FIG. 7 shows a top view of a pixel.

Besides, a top view of the pixel portion after the activation process described is above is shown in FIG. 7. Note that, the same reference numerals are used to indicate parts corresponding FIGS. 5A to 5C and FIG. 6. A dash line C-C' in FIGS. 6A to 6C corresponds to a sectional view taken along the line C-C' in FIG. 7. Also, a dash line D-D' in FIGS. 6A to 6C corresponds to a sectional view taken along the line D-D' in FIG. 7.

In addition, heat treatment at 300 to 550° C. for 1 to 12 hours is performed in an atmosphere containing hydrogen of 3 to 100%, to perform a step of hydrogenating the semiconductor layers. In this embodiment, the heat treatment is performed at 410° C. for 1 hour in an atmosphere containing hydrogen of about 3%. This step is a step of terminating dangling bonds in the semiconductor layer by contained in the interlayer insulating film. As another means for hydrogenation, plasma hydrogenation (using hydrogen excited by plasma) may be carried out.

Besides, in the case of using a laser annealing method as the activation process, it is preferred to irradiate laser light such as an excimer laser or a YAG laser after the hydrogenating process.

Next, a second interlayer insulating film 462 made of an organic resin and wirings 463 to 471 connected to respective semiconductor layers are formed. Then, patterning is performed using a photo mask to form a transparent conductive film 472 over the entire surface to obtain the state shown in FIG. 8.

As a material for the transparent conductive film, indium oxide ($In_2O_3$), an alloy of indium oxide and tin oxide ($In_2O_3$—$SnO_2$; ITO film) or the like may be used by a sputtering method, a vacuum evaporation method, or the like. An etching process of such material is performed with a hydrochloric acid based etching solution. Since etching of an ITO film particularly generates residue, an alloy of indium oxide and zinc oxide ($In_2O_3$—ZnO) may be used to improve the etching processability. An alloy of indium oxide and zinc oxide is excellent in surface smoothness, and is also excellent in heat stability to the ITO film. Thus, even when Al is used for the drain wiring and the capacitance connection wiring, corrosion reaction with Al which is contacted at the surface may be prevented. Similarly, zinc oxide (ZnO) is also an appropriate material, and further, zinc oxide added with gallium (Ga) (ZnO:Ga) or the like may be used in order to increase transmittivity and conductivity of visible light.

In the manner as described above, the driving circuit 306 including an n-channel TFT 301, a p-channel TFT 302, and an n-channel TFT 303, and the pixel portion 307 including the pixel TFT 304 and a storage capacitance 305 can be formed on the same substrate. In the present specification, such a substrate is called an active matrix substrate for convenience.

The n-channel TFT 301 of the driving circuit 306 includes a channel forming region 472, the impurity region 434b (GOLD region) overlapping with the second shape conductive layer 428 forming the gate electrode, the impurity region 434a (LDD region) formed outside the gate electrode, and the impurity region 439 functioning as a source region or a drain region. The p-channel TFT 302 includes a channel forming region 473, an impurity region 457 overlapping with the conductive layer 429 forming the gate electrode, an impurity region 456 formed outside the gate electrode, and the impurity region 455 functioning as a source region or a drain region. The n-channel TFT 303 includes a channel forming region 474, the impurity region 436b (GOLD region) overlapping with the second shape conductive layer 430 forming the gate electrode, an impurity region 436a (LDD region) formed outside the gate electrode, and the impurity region 441 functioning as a source region or a drain region.

The pixel TFT 304 of the pixel portion includes a channel forming region 475, the impurity region 437b (GOLD region) overlapping with the second shape conductive layer 431 forming the gate electrode, an impurity region 437a (LDD region) formed outside the gate electrode, and the impurity region 442 functioning as a source region or a drain region. Besides, impurity elements imparting p-type conductivity are added to the respective semiconductor layers 458 to 460 functioning as one of the electrodes of the storage capacitance 305 at the same concentration as the impurity region. The storage capacitance 305 is formed from the electrode 432b and 448 and the semiconductor layers 458 to 460 using the insulating film (the same film as the gate insulating film) as a dielectric member.

Figure 8:
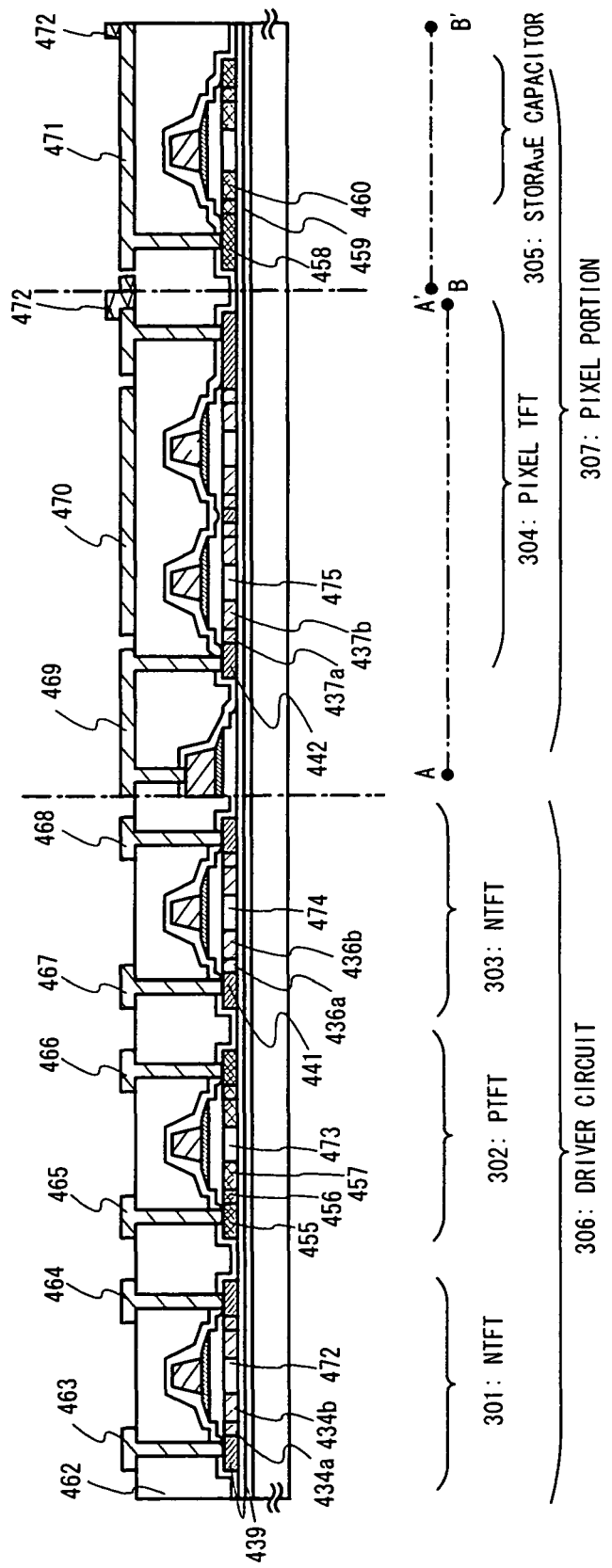
FIG. 8 shows a diagram showing the manufacturing process of the AM-LCD.
Figure 9:
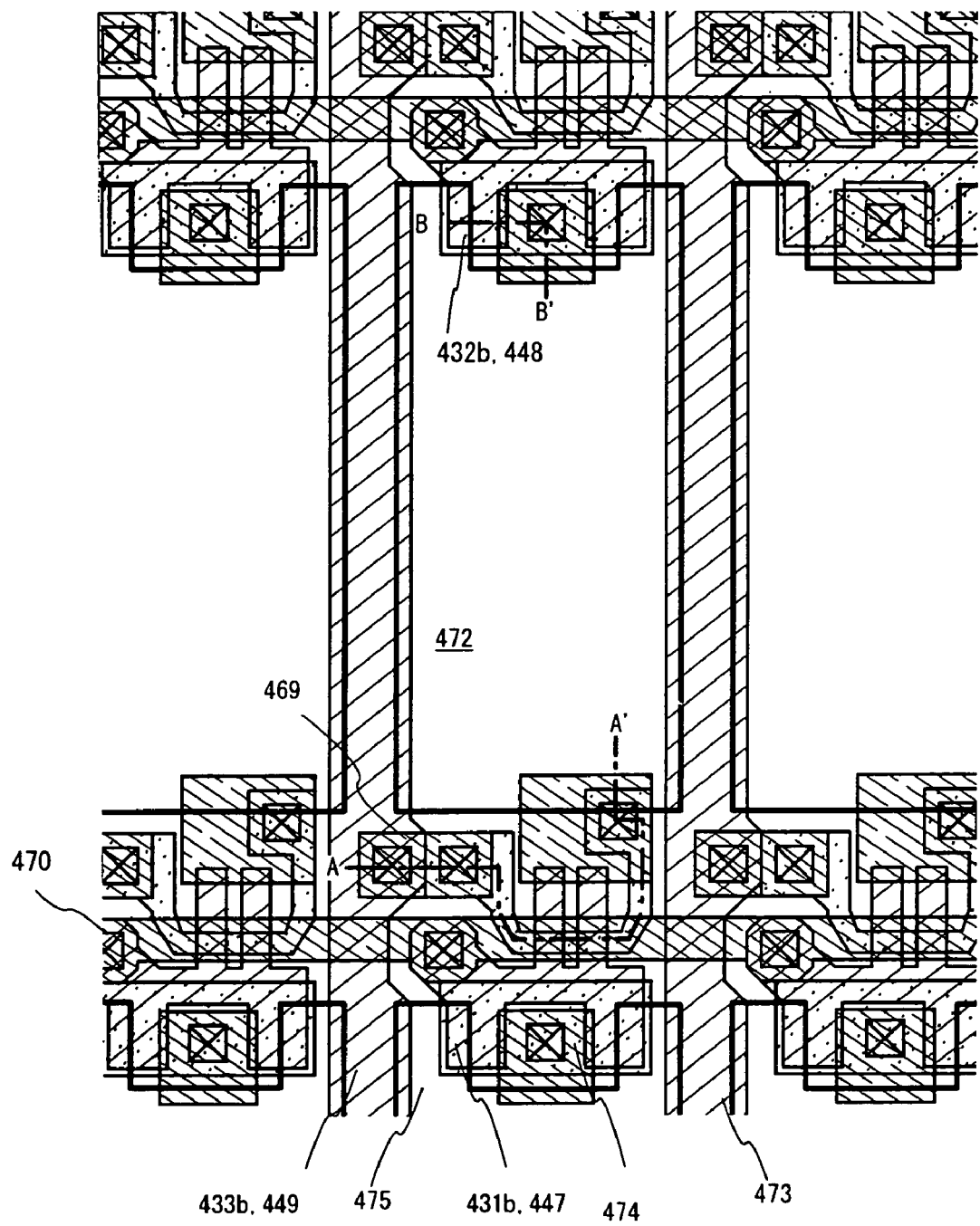
FIG. 9 shows a top view of a pixel.

A top view of the pixel portion of the active matrix substrate manufactured in this embodiment is shown in FIG. 9. Note that, the same reference numerals are used to indicate parts corresponding to FIGS. 5A to 5C and FIGS. 6 to 8. A dash line A-A' in FIG. 9 corresponds to a sectional view taken along the line A-A' in FIG. 8. Also, a dash line B-B' in FIG. 9 corresponds to a sectional view taken along the dash line B-B' in FIG. 8.

Like this, the active matrix substrate having a pixel structure according to the present embodiment has a feature such that electrodes 431b and 447 a part of which functions as the gate electrode and a gate wiring 470 are formed on different layers, so that the light shielding of the semiconductor layers are performed by the gate wiring 470.

Further, in the pixel structure of the present embodiment, an end portion of the pixel electrode is formed by arranging it so as to overlap with the source wiring so that the gap between the pixel electrodes is shielded from light without using a black matrix.

In addition, in accordance with the process steps of the present embodiment, the number of photo masks needed for the manufacture of the active matrix substrate may be made into six pieces (a semiconductor layer patterning mask, a first wiring patterning mask (including the electrodes 431b and 447, the electrodes 432b and 448, and the source wiring 433b and 449), a patterning mask of a source region and a drain region of a p-type TFT, a pattern mask of a contact hole formation, a second wiring patterning mask (including the connection electrode 467, the connection electrode 469, and the gate wiring 470). As a result, it can contribute to shorten the manufacturing steps, to lower the manufacturing cost, and to improve the yield.

Further, a liquid crystal display device may be obtained using the active matrix substrate fabricated in this embodiment in accordance with the steps in Embodiment 1, Embodiment 2, Embodiment 4 and Embodiment 5.

Embodiment 4

Figure 10:
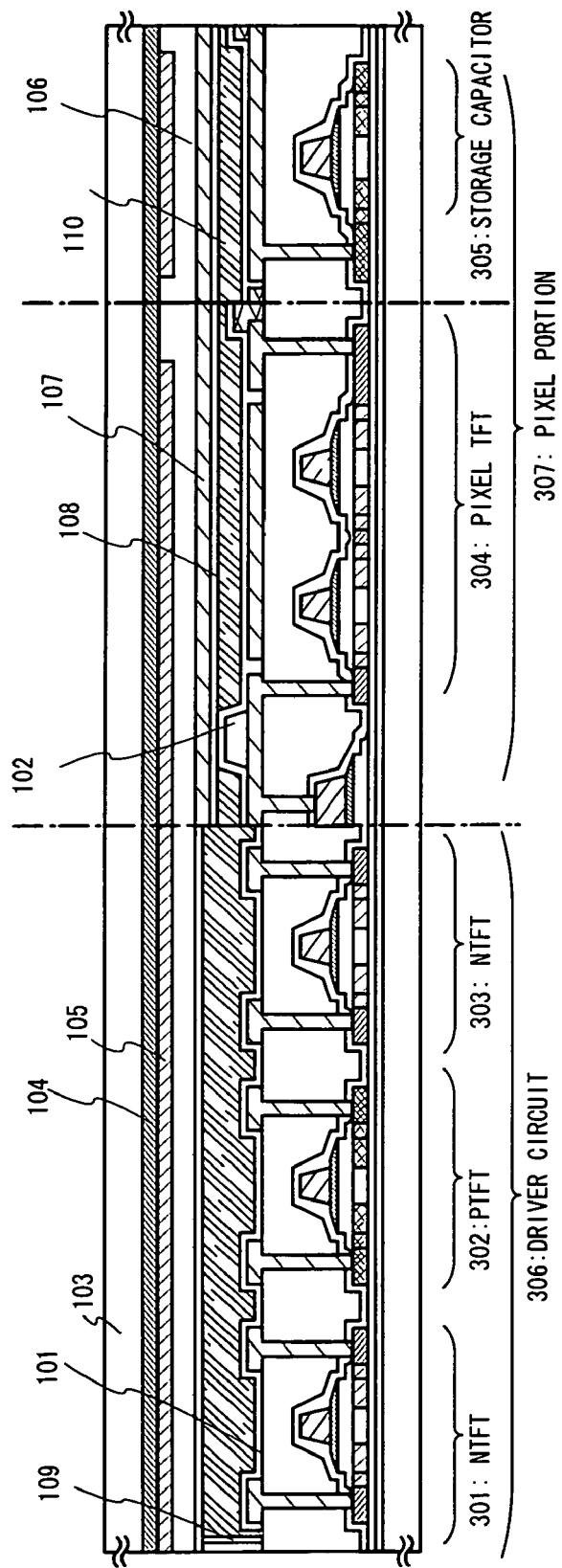
FIG. 10 shows a cross-sectional view of an active matrix liquid crystal display device.

In this embodiment, a process of manufacturing an active matrix liquid crystal display device from the active matrix substrate manufactured in Embodiment 3 will be described hereinbelow. FIG. 10 is used for an explanation thereof.

First, in accordance with Embodiment 3, the active matrix substrate in the state shown in FIG. 8 is obtained, and thereafter, an orientation film 101 is formed on the active matrix substrate as shown in FIG. 9, and is subjected to an orientation process. Note that, in this embodiment, before the formation of the orientation film 101, a columnar spacer 102 for maintaining a gap between the substrates is formed at a desired position by patterning an organic resin film such as an acrylic resin film. Further, spherical spacers may be scattered on the entire surface of the substrate in place of the columnar spacer.

Next, an opposing substrate 103 is prepared. A first colored layer 104, a second colored layer 105, and a leveling film 106 are formed on the opposing substrate 103. In accordance with Embodiment 1, a colored layer (B) is used as the first colored layer 104, and the colored layer (R) is used as the second colored layer 105. The first colored layer 104 and the second colored layer 105 are partially overlapped with each other, thereby forming a light shielding portion.

Subsequently, an opposing electrode 107 is formed in a pixel portion, and an orientation film 108 is formed on the entire surface of the opposing substrate. Then, the orientation process is performed thereon.

Then, the active matrix substrate on which the pixel portion and a driver circuit are formed is stuck with the opposing substrate by a sealing material 109. In the sealing material 109, a filler is mixed, and the two substrates are stuck together while keeping a uniform gap by the effect of this filler and the columnar spacer 102. Thereafter, a liquid crystal material is injected between both the substrates, to form a liquid crystal layer 110 sandwiched by the two substrates. Thereafter, the substrates are completely sealed by a sealant (not shown). A known liquid crystal material may be used as the liquid crystal material. Thus the active matrix liquid crystal display device shown in FIG. 10 is completed.

In this embodiment, the substrate shown in Embodiment 3 is used. Accordingly, in FIG. 9 showing a top view of the pixel portion in accordance with Embodiment 3, light shielding must be performed at least in gaps between a gate wiring 470 and a pixel electrode 472 (including, a gap between the gate wiring 470 and a connection electrode 469, a gap between the connection electrode 469 and the gate wiring 470, and a gap between the pixel electrode 472 and the connection electrode 469), gaps between source wirings 433b, 449 and a semiconductor layer 474 (including a gap between the gate wiring 470 and source wirings 433b, 449), and a gap between a source wiring 473 and the semiconductor layer 474. In this embodiment, the opposing substrate is stuck SO that the light shielding portion overlaps with the positions which need to be shielded from light.

Figure 11:
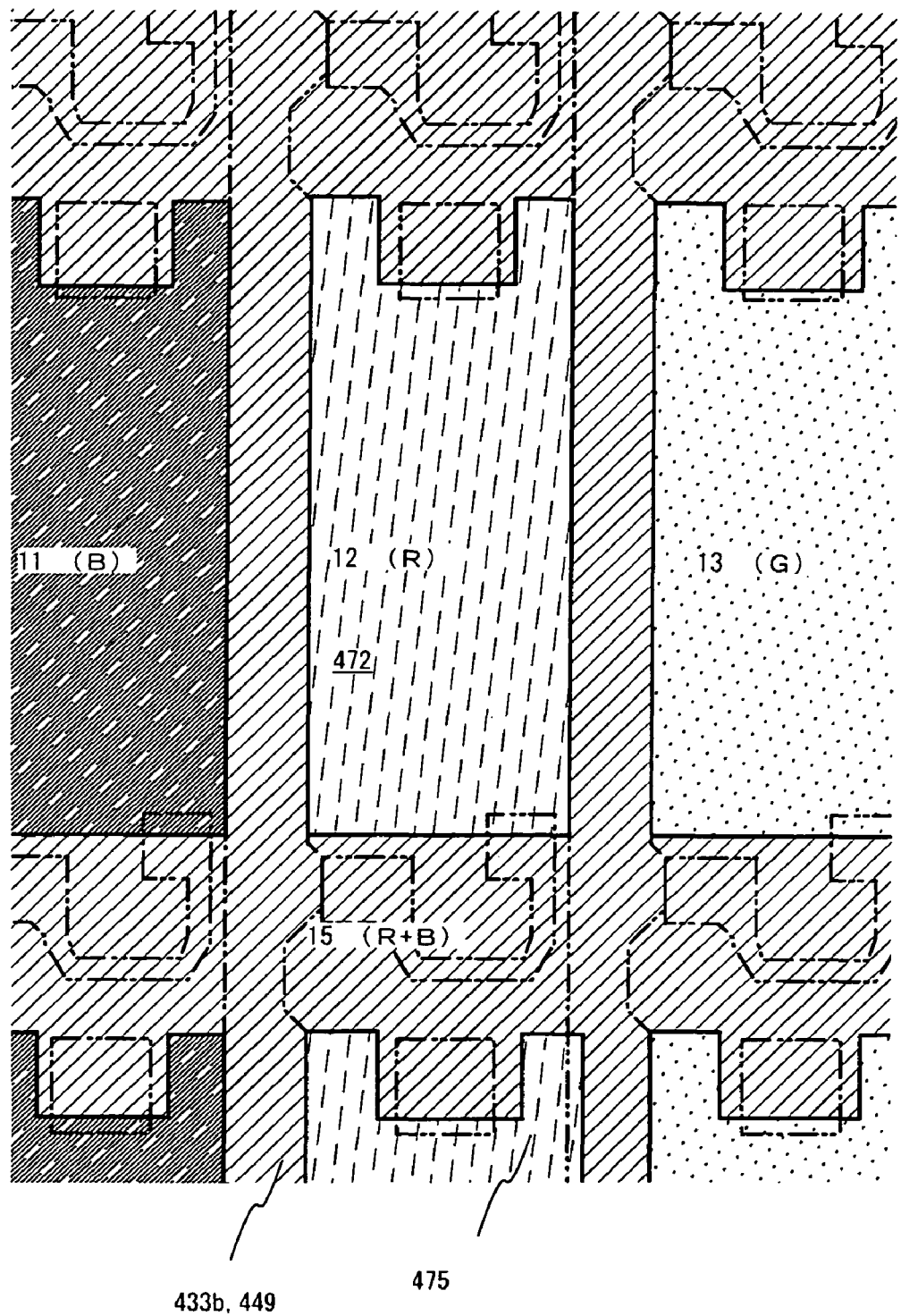
FIG. 11 shows a top view of an arrangement of colored layers.

Note that, FIG. 11 is a schematic view showing a part of the pixel portion of the completed liquid crystal display device. In FIG. 11, a colored layer (R) 12 is formed so as to overlap with the pixel electrode 472 indicated by chain lines. Note that, in FIG. 11, parts corresponding to those in FIG. 1A are indicated by the same reference numerals. Besides, the gap between the pixel electrode 472 and its adjacent pixel electrode 475 is shielded from light by a light shielding portion 15. This light shielding portion 15 is formed from a colored layer (B) 11 and the colored layer (R) 12 which are overlapped with each other. This light shielding portion 15 also shields the adjacent pixel TFT of the pixel (G) from light. Simultaneously, pattering is performed so that the colored layer (B) 11 and the colored layer (R) 12, with which the source wirings 433b and 449 overlap, overlaps with each other to thereby form the light shielding portion 15.

In this way, without using a black mask, the gaps between the respective pixels are shielded from light by the light shielding portion 15. As a result, reduction in the manufacturing steps can be attained.

In this embodiment, the colored layer (B) as the first colored layer 104 and the colored layer (R) as the second colored layer 105 are used, but the colored layer (R) as the first colored layer 104 and the colored layer (B) as the second colored layer 105 may be used.

Embodiment 5

Figure 12:
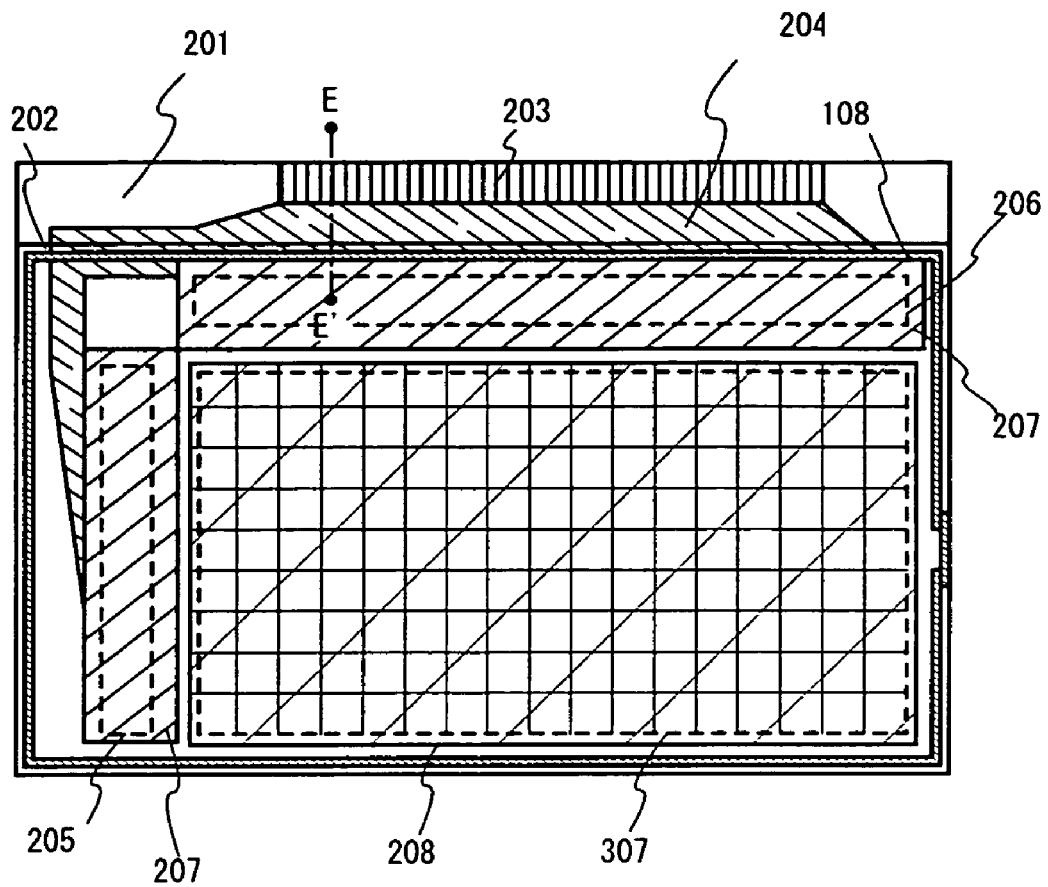
FIG. 12 shows an external view of an AM-LCD.

Referring to the top view of FIG. 12, the structure of the active matrix liquid crystal display device (FIG. 10) obtained by using Embodiment 4 is described. Note that, the parts corresponding to those in FIG. 10 use the same reference numerals.

In FIG. 12 showing a top view, an active matrix substrate 201, on which a pixel portion, a driver circuit, an external input terminal 203 for adhering an FPC (flexible printed circuit), a wiring 204 for connecting the external input terminal to the input portion of each circuit, and the like are formed, is stuck with an opposing substrate 202 formed with the colored layer and the like by the sealing material 108.

On a gate wiring driver circuit 205 and a source wiring driver circuit 206 are formed a red color filter or a light shielding portion 207 laminated with red and blue colored layers on the opposing substrate side. Further, in a colored layer 208 formed on the opposing substrate side on the pixel portion 307, respective colored layers of red (R), green (G) and blue (B) are provided corresponding to each pixel. When actually performing display, color display is performed with the three colors of the colored layers of red (R), green (G) and blue (B), but the arrangement of the colored layers of each color is arbitrary.

Figure 13A:
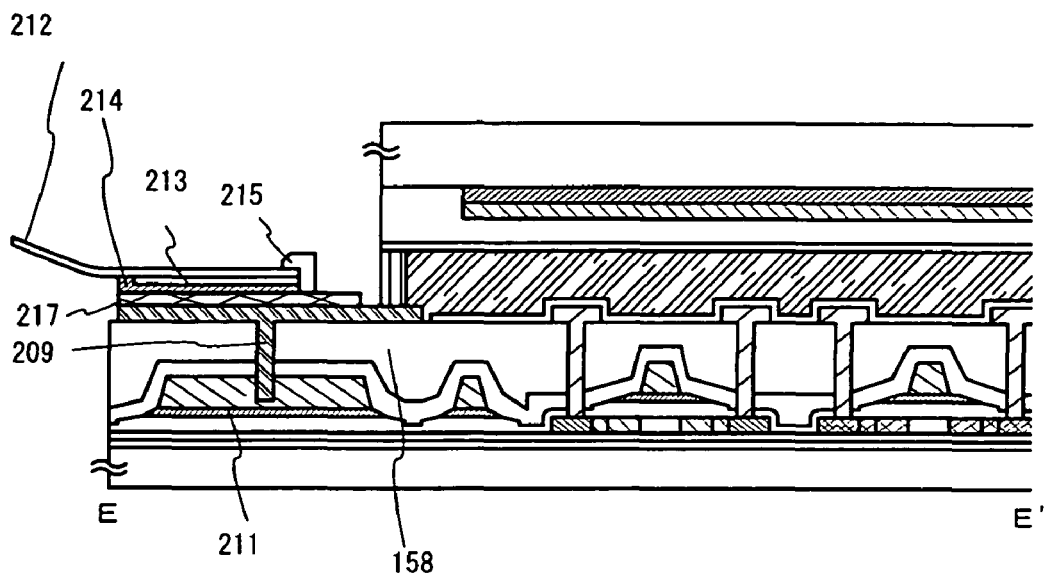
FIGS. 13A and 13B show a terminal portion of the AM-LCD.

FIG. 13A shows a cross-sectional view of the external input terminal 203 shown in FIG. 12 along the line E-E'. The external input terminal is formed on the active matrix substrate side, and the interlayer capacitance and the wiring resistance are lowered, to connect to the wiring 211 formed in the same layer as the gate wiring through an interlayer insulating film 210 by a wiring 209 to prevent failure from disconnection. A transparent conductive film 217 formed by patterning of a transparent conductive film in Embodiment 4 is provided on the wiring 209.

Further, the external input terminal is stuck with an FPC formed of a base film 212 and a wiring 213 by an anisotropic conductive resin 214. Further the mechanical strength is increased by a reinforcement plate 215.

Figure 13B:
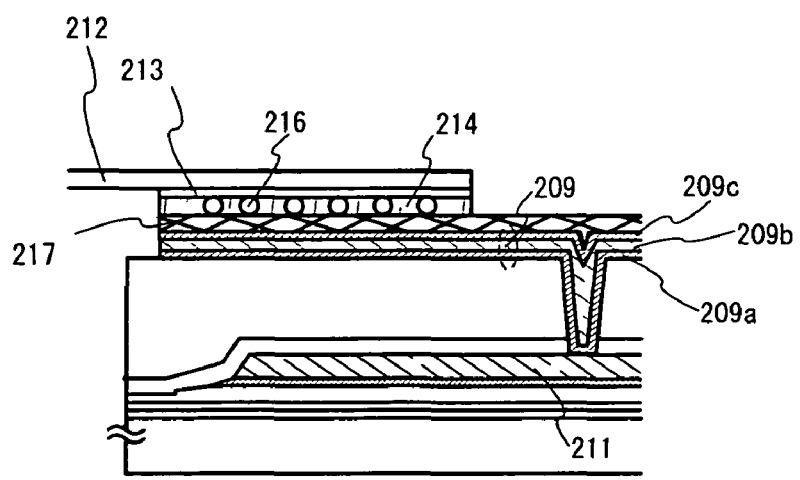

FIG. 13B shows a detailed cross-sectional view of the external input terminal shown in FIG. 13A. The external input terminal provided on the active matrix substrate side is formed of a wiring 211 formed of the same layer as the first electrode and the source wiring and the wiring 209 formed of the same layer as the pixel electrode. Of course, this is only one example showing the structure of the terminal portion and the external input terminal may be formed by just either one of the wirings. For example, in the case that the external input terminal is formed of the wiring 211 formed with the same layer as the first electrode and the source wiring, it is necessary to remove the interlayer insulating film formed thereon. The wiring 209 is formed of a three-layer structure of a Ti film 209a, an alloy film (an alloy film of Al and Ti) 209b, and a Ti film 209c. Further, the transparent conductive film 217 is formed on the Ti film 209a to improve the electric conductivity. The FPC is formed of the base film 212 and the wiring 213, and the wiring 213 and the transparent conductive film 217 are stuck together with an anisotropic conductive adhesive comprised of the heat hardening type adhesive 214 and conductive particles 216 scattered therein, to thereby form an electrical connecting structure.

In this way, the active matrix liquid crystal display device thus manufactured may be used as a display portion of various electric equipment.

Embodiment 6

Figure 14:
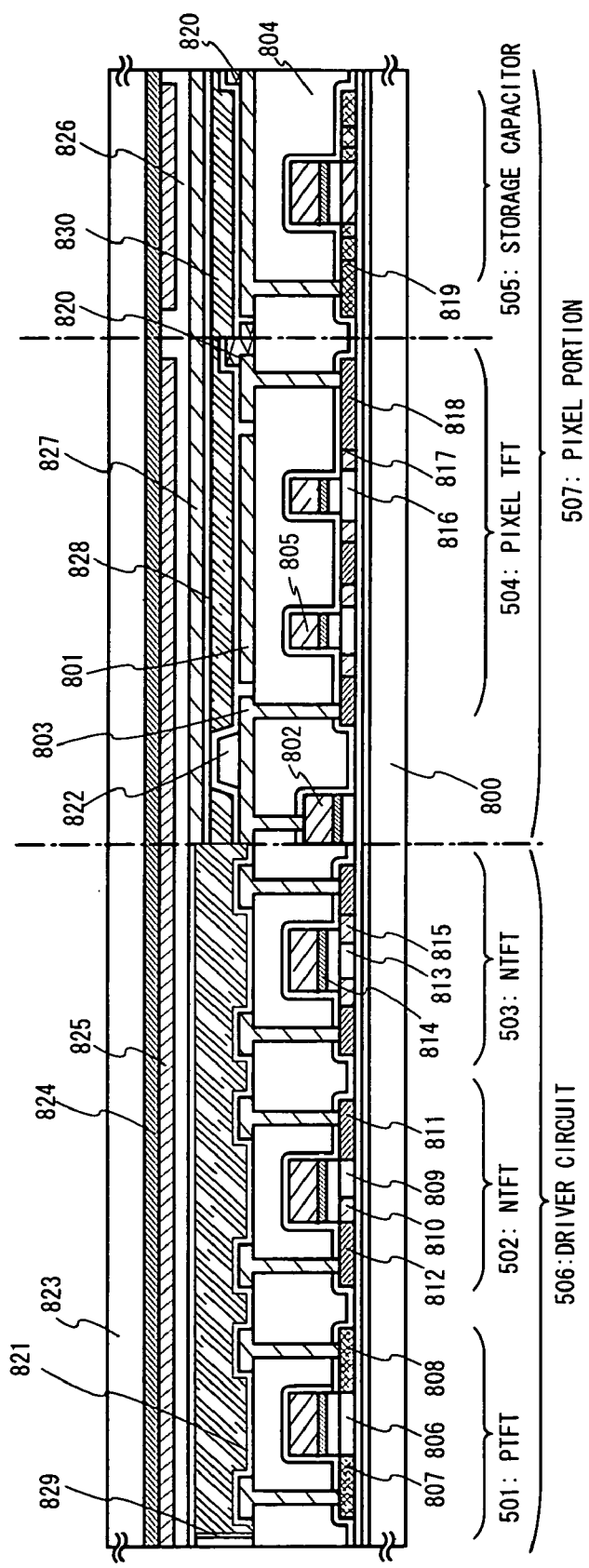
FIG. 14 shows a cross-sectional view of an active matrix liquid crystal display device.

Other example of the structures of the active matrix liquid crystal display device is shown using the cross-sectional view of FIG. 14.

An active matrix substrate 800 is featured in that a gate wiring 801 and a connection wiring 803 electrically connected to a source wiring 802 are on an interlayer insulating film 804, that is they are on the same layer. Further, in the active matrix substrate 800, a gate electrode 805 and the source wiring 802 are simultaneously formed by tungsten, and the gate wiring 801 and the connection wiring 803 are manufactured simultaneously by aluminum. Further, in the active matrix substrate 800, a driver circuit 506 having a p-channel TFT 501, an n-channel TFT 502 and an n-channel TFT 503, and a pixel portion 507 having a pixel TFT 504 and a storage capacitance 505 are formed on the same substrate.

The p-channel TFT 501 of the driver circuit 506 is formed with a single drain structure having a channel forming region 806, a source region 807 and a drain region 808 comprising p-type impurity regions with high concentration. The first n-channel TFT 502 comprises a channel forming region 809, an LDD region 810, a drain region 811 and a source region 812 in the island-shape semiconductor layer. The second n-channel TFT 503 of the driver circuit 506 comprises an LDD region 815 where a portion thereof overlaps with a channel forming region 813 and a gate electrode 814 in the island-shape semiconductor layer. The pixel TFT 504 has a channel forming region 816, an LDD region 817, and a source or drain region 818 in the island shaped semiconductor layer. The source or drain region 818 is electrically connected with a pixel electrode 820. Further, the storage capacitance 505 has an electrical connection with the impurity region 819 and the pixel electrode 820.

Throughout this specification such a substrate is referred to as the active matrix substrate 800 for the sake of convenience.

Next, an orientation film 821 is formed on the active matrix substrate 800, and the orientation process is performed thereon. Note that, before forming the orientation film 821, a columnar spacer 822 is formed in the desired position to maintain the gap between the substrates by patterning an organic resin film such as an acrylic resin film. Further, in place of the columnar spacer, a spherical spacer may be scattered on the entire surface of the substrate.

Next, an opposing substrate 823 is prepared. A first colored layer 824, a second colored layer 825, and a leveling film 826 are formed on the opposing substrate 823. In accordance with Embodiment 1, a colored layer (B) is used as the first colored layer 824, and the colored layer (R) is used as the second colored layer 825. The first colored layer 824 and the second colored layer 825 are partially overlapped with each other, thereby forming a light shielding portion. In regions other than the upper portion of the pixel electrode, the first colored layer 824 and the second colored layer 825 are partially overlapped with each other, thereby forming a light shielding portion.

Next, an opposing electrode 827 is formed in the pixel portion, an orientation film 828 is formed on the entire surface of the opposing substrate, and an orientation process is conducted.

Then, the active matrix substrate formed with a pixel portion and a driver circuit, and the opposing substrate are stuck together with a sealing material 829. Thereafter, a liquid crystal material is injected between the substrates, to form a liquid crystal layer 830 sandwiched by the two substrates. Thereafter, the substrate is completely sealed by a sealant (not shown). A known liquid crystal material may be used as the liquid crystal material.

Thus, the active matrix liquid crystal display device shown in FIG. 14 is completed.

Embodiment 7

Figure 15:
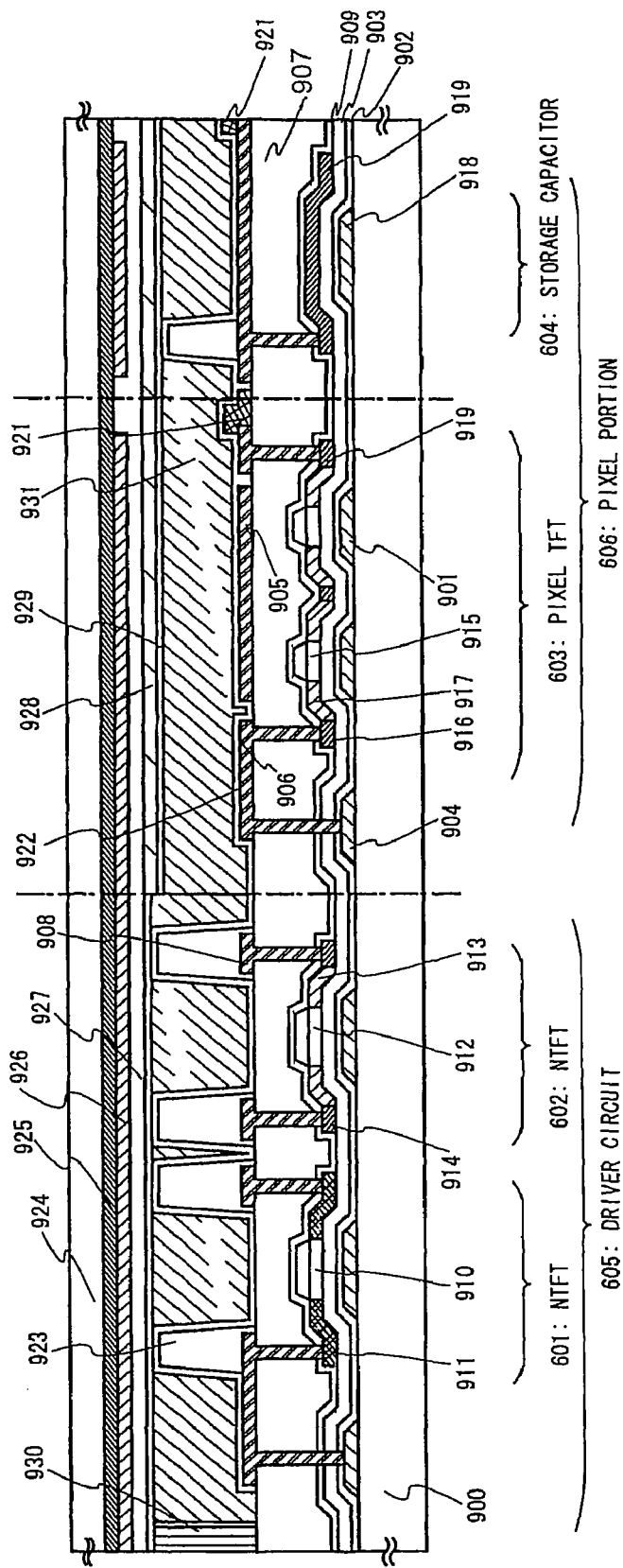
FIG. 15 shows a cross-sectional view of an active matrix liquid crystal display device.

In this embodiment, a liquid crystal display device having a reverse stagger type TFT is described using FIG. 15.

A gate electrode 901 of a pixel TFT is formed on the substrate surface to thereby form a semiconductor layer through a first insulating layer 902 and a second insulating layer 903. A source wiring 904 is formed on the same substrate surface as the gate electrode 901. A gate wiring 905 and a connection wiring (connection electrode) 906 is formed on a fourth insulating layer (leveling film) 907 formed on the semiconductor layer. Then, the gate wiring 905 and a connection wiring (connection electrode) 908 are respectively connected to the gate electrode 901 and the semiconductor layer through the contact holes. Further, the source wiring 904 and the semiconductor layer are connected by the connection wiring 906 formed in the same layer as the gate wiring 905. Further, a protective film 909 (third insulating layer) is formed.

A driver circuit 605 having a p-channel TFT 601 and an n-channel TFT 602 on the same substrate and a pixel portion 606 having a pixel TFT 603 and a storage capacitance 604 are formed on the same substrate. In the p-channel TFT 601 of the driver circuit 605, are formed a channel forming region 910, a source or drain region 911. In the n-channel TFT 602, a channel forming region 912, an LDD region 913, and a source or drain region 914 are formed. The pixel TFT 603 of the pixel portion 606 has a multi gate structure, and is formed with a channel forming region 915, a source or drain region 916, and an LDD region 917. The storage capacitance 604 is formed of a capacitance wiring 918, a semiconductor layer 919 and a third insulating layer 909 and the fourth insulating layer 907 formed therebetween.

A source or drain region 920 is electrically connected with a pixel electrode 921. Further, the pixel electrode 921 is connected with the semiconductor layer 919 of the storage capacitance 604.

Throughout this specification, such a substrate is referred to as an active matrix substrate 900 for the sake of convenience.

Next, an orientation film 922 is formed on the active matrix substrate 900, and the orientation process is performed thereon. Note that, before forming the orientation film 922, a columnar spacer 923 is formed in the desired position to maintain the gap between the substrates by patterning an organic resin film such as an acrylic resin film. Further, in place of the columnar spacer, a spherical spacer may be scattered on the entire surface of the substrate.

Next, an opposing substrate 924 is prepared. A first colored layer 925, a second colored layer 926, and a leveling film 927 are formed on the opposing substrate 924. In accordance with Embodiment 1, a colored layer (B) is used as the first colored layer 925, and the colored layer (R) is used as the second colored layer 926. The first colored layer 925 is formed above the pixel electrode. In the region other than the upper portion of the pixel electrode, the first colored layer 925 and the second colored layer 926 are partially overlapped with each other, thereby forming a light shielding portion.

Next, an opposing electrode 928 is formed in the pixel portion, an orientation film 929 is formed on the entire surface of the opposing substrate, and an orientation process is conducted.

Then, the active matrix substrate formed with a pixel portion and a driver circuit, and the opposing substrate are stuck together by a sealing material 930. Thereafter, a liquid crystal material is injected between the substrates, to form a liquid crystal layer 931 sandwiched by the two substrates. Thereafter, the substrates are completely sealed by a sealant (not shown). A known liquid crystal material may be used as the liquid crystal material.

An advantage of forming the TFT as a reverse stagger type, is that the LDD region which overlaps with the gate electrode in the n-channel TFT, may be formed in a self-aligning manner by a process of exposing the back surface. With the feature that the gate insulating film and the semiconductor layer may be continuously formed, the characteristic variation of the TFT may be kept low.

Embodiment 8

Figure 16:
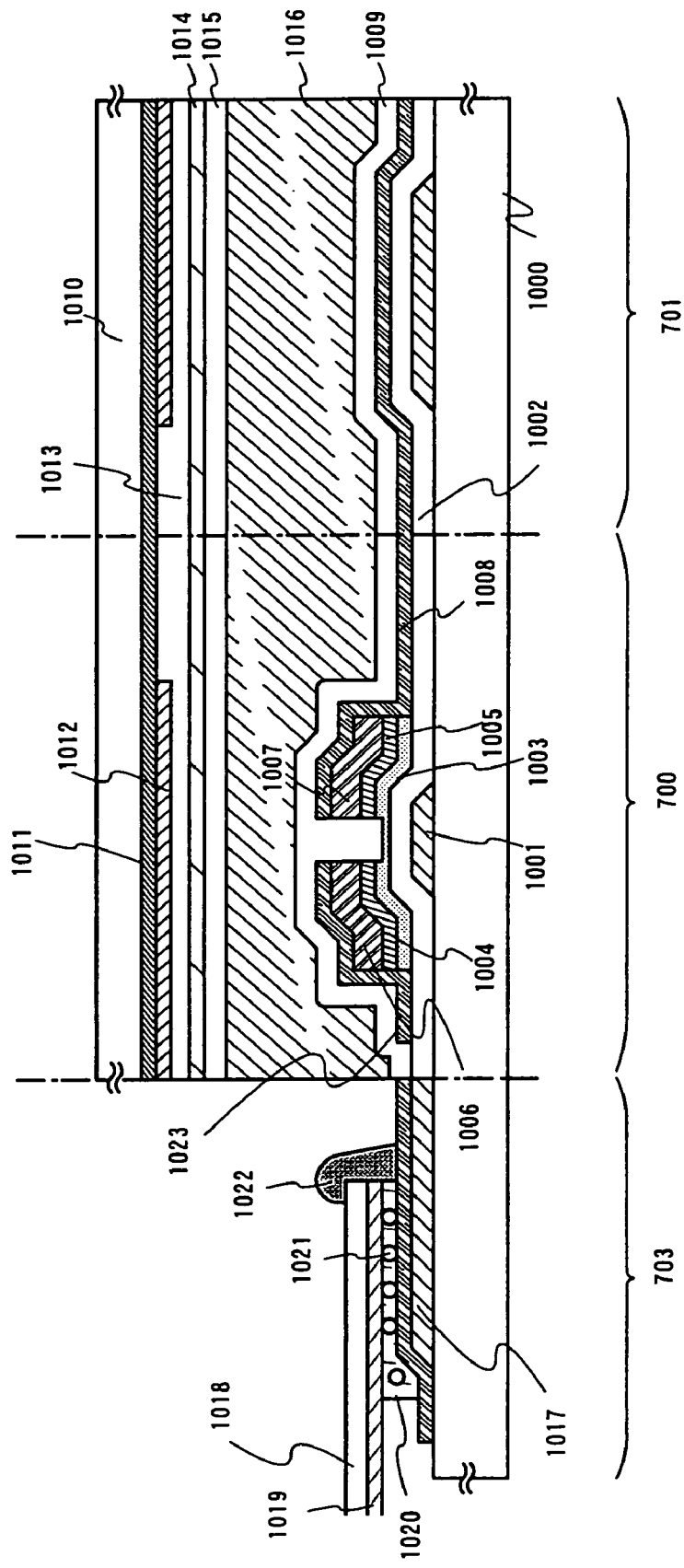
FIG. 16 shows a cross-sectional view of an active matrix liquid crystal display device.

In this embodiment, referring to FIG. 16, the manufacturing method of the liquid crystal display device using the bottom gate TFT structure of the channel etch type is described. This TFT is featured in that the patterning of the source region and the drain region and the patterning of the pixel electrode use the same photomask.

The structure of an active matrix substrate 1000 used in this embodiment comprises a gate wiring 1001 formed on the insulating surface, an insulating film 1002 formed on the gate wiring 1001, an amorphous semiconductor film 1003 formed on the insulating film 1002, a source region 1004 and a drain region 1005 formed on the amorphous semiconductor film 1003, a source wiring 1006 and an electrode (drain electrode) 1007 formed on the source region 1004 and the drain region 1005, and a pixel electrode 1008 formed on the electrode 1007, and one end surface of the drain region 1005 and the source region 1004 substantially matches the end surface of the amorphous semiconductor film 1003 and the end surface of the electrode 1007. Reference numerals 700 and 701 respectively indicate the pixel TFT portion and the capacitance portion.

Next, an orientation film 1009 is formed on the active matrix substrate 1000, and the orientation process is performed thereon. Note that, in this embodiment, although it is not shown, a columnar spacer or a spherical spacer may be formed on the orientation film 1009.

Next, an opposing substrate 1010 is prepared. A first colored layer 1011, a second colored layer 1012, and a leveling film 1013 are formed on the opposing substrate 1010. In accordance with Embodiment 1, a colored layer (B) is used as the first colored layer 1011, and a colored layer (R) is used as the second colored layer 1012. The first colored layer 1011 and the second colored layer 1012 are partially overlapped with each other, thereby forming a light shielding portion.

Subsequently, an opposing electrode 1014 is formed, and an orientation film 1015 is formed on the entire surface of the opposing substrate 1010. Then, the orientation process is performed thereon.

Then, the active matrix substrate 1000 on which the pixel TFT portion 700 and the capacitance portion 701 are formed is stuck with the opposing substrate 1010 by a sealing material (not shown). Thereafter, a liquid crystal material is injected between both the substrates, to form a liquid crystal layer 1016 sandwiched by the two substrates. Thereafter, the substrates are completely sealed by a sealant (not shown). A known liquid crystal material may be used as the liquid crystal material.

Next a flexible printed circuit is connected to an input terminal 1017 of the terminal portion. In the FPC, an organic resin film 1018 such as polyamide is formed with a copper wiring 1019, and the FPC is connected with a transparent conductive film covering the input terminal with an anisotropic conductive adhesive. The anisotropic conductive adhesive is comprised of an adhesive 1020, and particles 1021 mixed therewith and having a conductive surface with a diameter of several tens to several hundreds of μm plated with gold or the like. The particles 1021 contact the transparent conductive film on the input terminal 1017 and the copper wiring 1019 to form an electrical contact in such a portion. Further, in order to increase the mechanical strength in this part, a resin layer 1022 is provided. In this way, an active matrix liquid crystal display device as shown in FIG. 16 is completed.

In the active matrix liquid crystal display device, the source wiring is covered by a conductive film 1023 which is the same material as the pixel electrode, so that it has a structure that protects the entire substrate from external static electricity, or the like. Further, the structure, in which a protective circuit is formed in the region other than the pixel TFT portion 700 by using the conductive film 1023, may be adopted. Such a structure enables the prevention of occurrence of static electricity due to friction between the manufacturing device and the insulating substrate in the manufacturing process. In particular, the TFT or the like may be protected from static electricity that generates at the time of rubbing in the orientation process performed in the manufacturing process.

Embodiment 9

A TFT formed by implementing any one of the above embodiments 1 to 8 can be used in various electro-optical devices (such as an active matrix type liquid crystal display device and an active matrix type EC display device). Namely, the present invention can be implemented in all electronic equipment in which these electro-optical devices are built into a display portion.

The following can be given as such electronic equipment: a personal computer, a video camera, a digital camera, a head-mounted display (goggle type display), digital versatile disc player (electronic playing equipment), and a portable information terminal (such as a mobile computer, a portable telephone or electronic book), a car navigation system, a car stereo and a digital camera. Examples of these are shown in FIGS. 18 and 19.

Figure 18A:
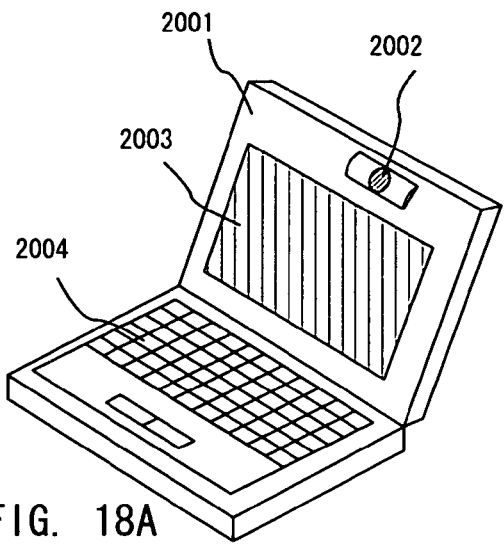
FIGS. 18A to 18F show examples of electrical equipment.

FIG. 18A is a personal computer, and it includes a main body 2001, an image input portion 2002, a display portion 2003, and a keyboard 2004. The present invention can be applied to the display portion 2003.

Figure 18B:
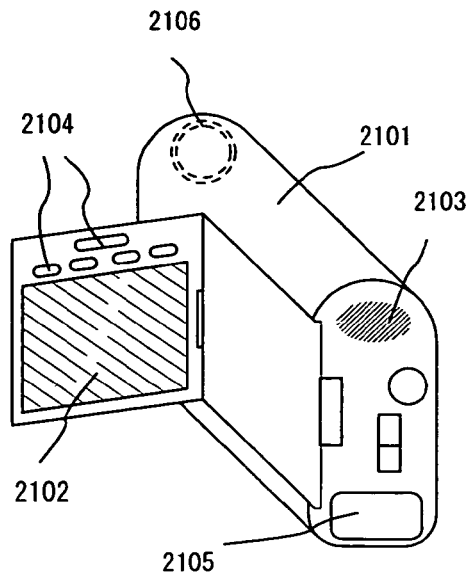

FIG. 18B is a video camera, and it includes a main body 2101, a display portion 2102, an audio input portion 2103, operation switches 2104, a battery 2105, and an image receiving portion 2106. The present invention can be applied to the display portion 2102.

Figure 18C:
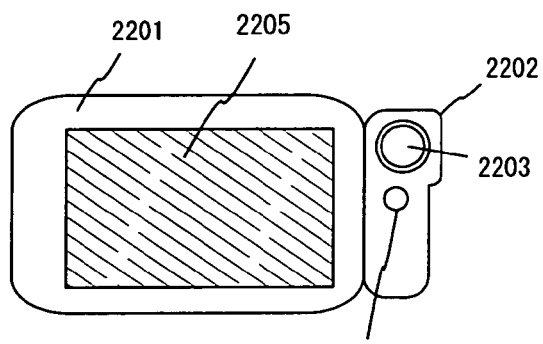

FIG. 18C is a mobile computer, and it includes a main body 2201, a camera portion 2202, an image receiving portion 2203, operation switches 2204, and a display portion 2205. The present invention can be applied to the display portion 2205.

Figure 18D:
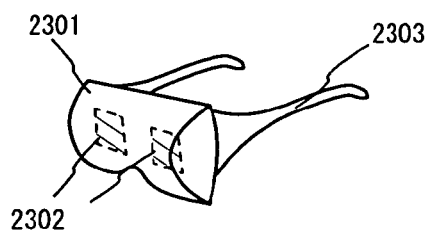

FIG. 18D is a goggle type display device, and it includes a main body 2301, a display portion 2302, and arm portion 2303. The present invention can be applied to the display portion 2302.

Figure 18E:
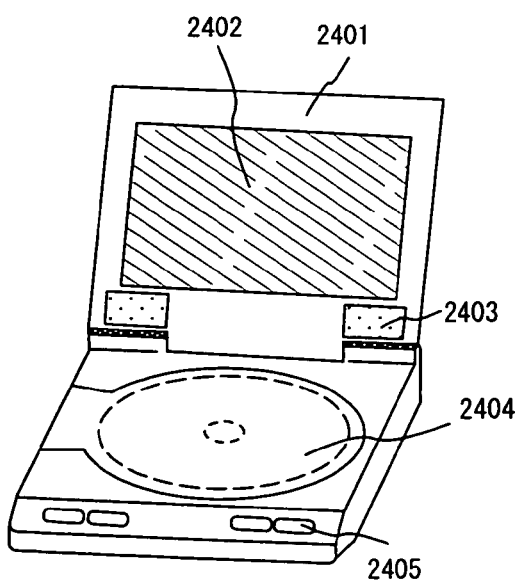

FIG. 18E is a player that uses a recording medium on which a program is recorded (hereafter referred to as a recording medium), and the player includes a main body 2401, a display portion 2402, a speaker portion 2403, a recording medium 2404, and operation switches 2405. Note that this player uses a recording medium such as a DVD (digital versatile disk) or a CD, and the appreciation of music, the appreciation of film, game playing and the Internet can be performed. The present invention can be applied to the display portion 2402.

Figure 18F:
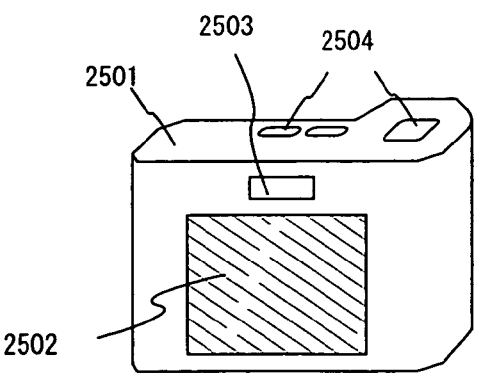

FIG. 18F is a digital camera, and it includes a main body 2501, a display portion 2502, an eyepiece portion 2503, operation switches 2504, and an image receiving portion (not shown in the figure). The present invention can be applied to the display portion 2502.

Figure 19A:
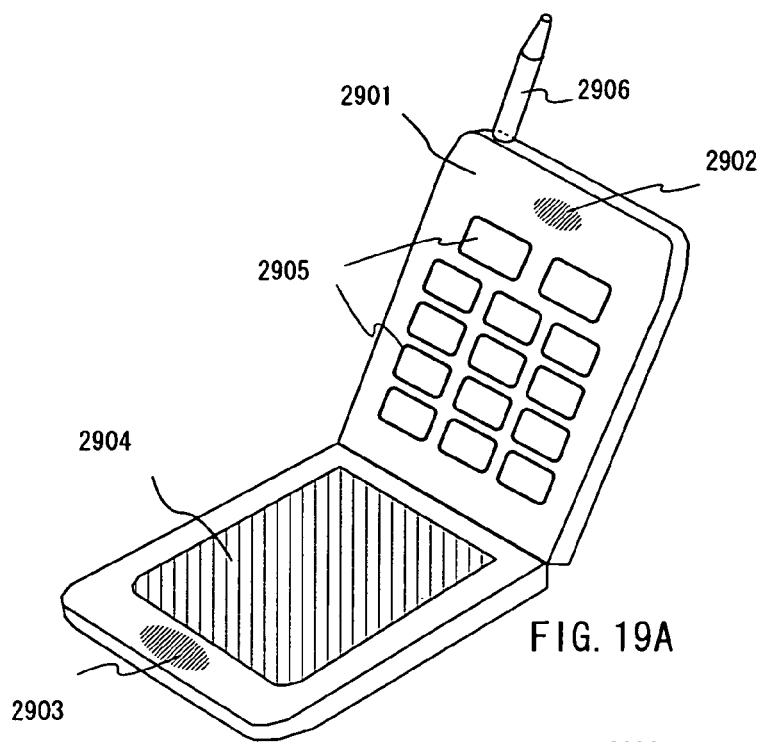
FIGS. 19A to 19C show examples of electrical equipment.

FIG. 19A is a portable telephone, and it includes a main body 2901, an audio output portion 2902, an audio input portion 2903, a display portion 2904, operation switches 2905, and an antenna 2906. The present invention can be applied to the display portion 2904.

Figure 19B:
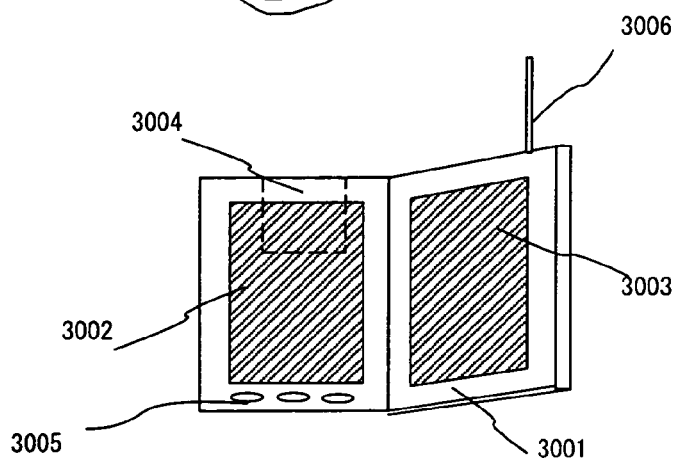

FIG. 19B is a portable book (electronic book), and it includes a main body 3001, display portions 3002 and 3003, a recording medium 3004, operation switches 3005, and an antenna 3006. The present invention can be applied to the display portions 3002 and 3003.

Figure 19C:
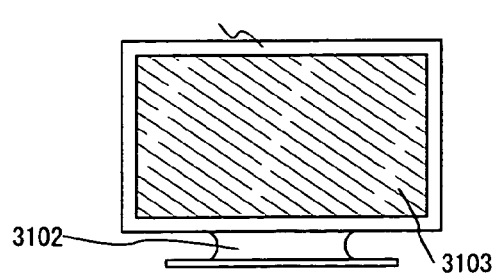

FIG. 19C is a display, and it includes a main body 3101, a support stand 3102, and a display portion 3103. The present invention can be applied to the display portion 3103. The display of the present invention is advantageous for a large size screen in particular, and is advantageous for a display equal to or greater than 10 inches (especially equal to or greater than 30 inches) in the opposite angle.

The applicable range of the present invention is thus extremely wide, and it is possible to apply the present invention to electronic equipment in all fields. Further, the electronic equipment of the embodiment 9 can be realized by using a constitution of any combination of the embodiments 1 to 7.

In the present invention, the light shielding portion is formed from a lamination film (R+B) formed of two colored layers, and as a result, the process of forming a black matrix is omitted.

What is claimed is:

1. An electro-optical device comprising:
   a gate electrode formed over a first substrate;
   a source wiring formed over said first substrate;
   a first insulating film formed on said gate electrode and said source wiring;
   a semiconductor layer formed over said first insulating film, and having at least a source region, a drain region, and a channel formation region interposed therebetween;
   a second insulating film covering at least said semiconductor layer;
   a gate wiring formed on said second insulating film, and electrically connected to said gate electrode;
   a connection wiring for electrically connecting said source wiring and said semiconductor layer, and formed on said second insulating film;
   a second substrate opposed to said first substrate;
   a light shielding portion comprising a first colored layer and a second colored layer;
   a first pixel opening comprising said first colored layer, a second pixel opening comprising said second colored layer and a third pixel opening comprising a third colored layer; and
   an organic resin film covering said light shielding portion, said first colored layer, said second colored layer and said third colored layer,
   wherein said light shielding portion overlaps the channel formation region;
   wherein a liquid crystal is interposed between said organic resin film and said channel formation region;
   wherein said organic resin film has a thickness of 1μm or more;
   wherein said light shielding portion is interposed between said second substrate and said liquid crystal; and
   wherein a pixel electrode is electrically connected to said source region or said drain region, said pixel electrode comprises a transparent conductive film.

2. An electro-optical device according to claim 1, wherein said first colored layer is blue,
   wherein said second colored layer is red; and
   wherein said third colored layer is green.

3. An electro-optical device according to claim 1, wherein said electro-optical device is a transmissive liquid crystal display device.

4. An electro-optical device according to claim 1, wherein said electro-optical device is selected from the group consisting of a personal computer, a video camera, a portable information terminal, a digital camera, a digital versatile disc player or an optical game machine.

5. An electro-optical device according to claim 1, wherein said gate wiring overlaps a portion of said semiconductor layer containing at least said channel formation region.

6. An electro-optical device according to claim 1, wherein said gate electrode and said source wiring comprise a same material.

7. An electro-optical device according to claim 1, wherein said first insulating film is a gate insulating film.

8. An electro-optical device according to claim 1, wherein a step exists at a portion where said first colored layer overlaps said second colored layer.

9. An electro-optical device according to claim 1, wherein said organic resin film is a leveling film.

10. An electro-optical device comprising:
    a gate electrode formed over a first substrate;
    a source wiring formed over said first substrate;
    a first insulating film formed on said gate electrode and said source wiring;
    a semiconductor layer formed over said first insulating film, and having at least a source region, a drain region, and a channel formation region interposed therebetween;
    a second insulating film covering at least said semiconductor layer;
    a gate wiring formed on said second insulating film, and electrically connected to said gate electrode;
    a connection wiring for electrically connecting the source wiring and the semiconductor layer, and formed on said second insulating film;
    a second substrate opposed to said first substrate;
    a first colored layer, a second colored layer and a third colored layer formed on said second substrate;
    a light shielding portion comprising said first colored layer and said second colored layer; and
    an organic resin film covering said light shielding portion, said first colored layer, said second colored layer, and said third colored layer,
    wherein said light shielding portion overlaps said channel formation region;
    wherein a liquid crystal is interposed between said organic resin film and said channel formation region;
    wherein said organic resin film has a thickness of 1μm or more;
    wherein a pixel electrode is electrically connected to said source region or said drain region, said pixel electrode comprises a transparent conductive film; and
    wherein said light shielding portion is interposed between said second substrate and said liquid crystal.

11. An electro-optical device according to claim 10, wherein said first colored layer is blue,
    wherein said second colored layer is red; and
    wherein said third colored layer is green.

12. An electro-optical device according to claim 10, wherein said gate wiring overlaps a portion of said semiconductor layer containing at least said channel formation region.

13. An electro-optical device according to claim 10, wherein said gate electrode and said source wiring comprise a same material.

14. An electro-optical device according to claim 10, wherein said first insulating film is a gate insulating film.

15. An electro-optical device according to claim 10, wherein a step exists at a portion where said first colored layer overlaps said second colored layer and said third colored layer.

16. An electro-optical device according to claim 10, wherein said organic resin film is a leveling film.

17. An electro-optical device comprising:
a first substrate;
a reverse stagger type thin film transistor formed over said first substrate, said reverse stagger type thin film transistor comprising;
a gate electrode;
a first insulating film formed on said gate electrode; and
a channel formation region, a source region and a drain region formed over the first insulating film;
a source wiring formed over said first substrate,
wherein the source wiring is electrically connected to said source region through a second wiring formed over the first insulating film, and
wherein the first insulating film is formed on the source wiring;
a second insulating film over at least the channel formation region, the source region and the drain region,
wherein the second wiring is formed on said second insulating film,
a gate wiring formed on said second insulating film, and electrically connected to said gate electrode;
a pixel electrode comprising a first transparent conductive film, and electrically connected to said drain region;
a second substrate opposed to said first substrate;
at least a first colored layer and a second colored layer formed on said second substrate, wherein said first colored layer and said second colored layer partly overlap each other,
wherein said first colored layer and said second colored layer partly overlap each other to form a light shielding portion, and
wherein said light shielding portion overlaps at least said channel formation region;
an organic resin film covering said first and second colored layers;
an opposing electrode comprising a second transparent conductive film; and
a liquid crystal interposed between said pixel electrode and said opposing electrode, wherein said organic resin film is interposed between said liquid crystal and said first and second colored layers,
wherein said organic resin film covers said first and second colored layers and said light shielding portion,
wherein said organic resin film has a thickness of 1 µm or more, and
wherein said opposing electrode is interposed between said liquid crystal and said organic. resin film.

18. An electro-optical device according to claim 17, wherein a step exists at a portion where said first colored layer overlaps said second colored layer.

19. An electro-optical device according to claim 17, wherein said organic resin film is a leveling film.

20. An electro-optical device comprising:
a first substrate;
a reverse stagger type thin film transistor formed over said first substrate, said reverse stagger type thin film transistor comprising;
a gate electrode;
a first insulating film formed on said gate electrode;
a channel formation region, a source region and a drain region formed over the first insulating film;
a source wiring formed over said first substrate,
wherein the source wiring is electrically connected to said source region through a second wiring formed over the first insulating film, and
wherein the first insulating film is formed on the source wiring;
a second insulating film over at least the channel formation region, the source region and the drain region,
wherein the second wiring is formed on said second insulating film;
a gate wiring formed on said second insulating film, and electrically connected to said gate electrode;
a pixel electrode electrically connected to said drain region;
a second substrate opposed to said first substrate;
a first colored layer, a second colored layer and a third colored layer formed on said second substrate, wherein said first colored layer and said second colored layer partly overlap each other,
wherein said first colored layer, said second colored layer and said third colored layer partly overlap each other to form a light shielding portion,
wherein said light shielding portion overlaps at least said channel formation region;
an organic resin film covering said first, second and third colored layers; and
a liquid crystal interposed between said first substrate and said second substrate, wherein said organic resin film is interposed between said liquid crystal and said first, second and third colored layers,
wherein said organic resin film covers said first, second and third colored layers and said light shielding portion, and
wherein said organic resin film has a thickness of 1 µm or more.

21. An electro-optical device according to claim 20, wherein a step exists at a portion where said first colored layer overlaps said second colored layer.

22. An electro-optical device according to claim 20, wherein said organic resin film is a leveling film.

* * * * *